(12) United States Patent
Tanzawa

(10) Patent No.: US 11,658,633 B2
(45) Date of Patent: May 23, 2023

(54) IMPEDANCE ADJUSTMENT CIRCUIT, POWER CONVERSION ELEMENT, AND POWER SUPPLY ELEMENT

(71) Applicant: NATIONAL UNIVERSITY CORPORATION SHIZUOKA UNIVERSITY, Shizuoka (JP)

(72) Inventor: Toru Tanzawa, Hamamatsu (JP)

(73) Assignee: National University Corporation Shizuoka University

( * ) Notice: Subject to any disclaimer, the term of this patent is extended or adjusted under 35 U.S.C. 154(b) by 313 days.

(21) Appl. No.: 17/048,261

(22) PCT Filed: Apr. 19, 2019

(86) PCT No.: PCT/JP2019/016863
§ 371 (c)(1),
(2) Date: Oct. 16, 2020

(87) PCT Pub. No.: WO2019/203355
PCT Pub. Date: Oct. 24, 2019

(65) Prior Publication Data
US 2021/0044270 A1 Feb. 11, 2021

(30) Foreign Application Priority Data

Apr. 20, 2018 (JP) .............................. JP2018-081478

(51) Int. Cl.
*H03H 7/40* (2006.01)
*H03H 7/06* (2006.01)
(Continued)

(52) U.S. Cl.
CPC ................ *H03H 7/40* (2013.01); *H02M 3/07* (2013.01); *H03H 7/06* (2013.01); *H03H 7/1791* (2013.01)

(58) Field of Classification Search
CPC .......... H03H 7/40; H03H 7/06; H03H 7/1791; H02M 3/07
(Continued)

(56) References Cited

U.S. PATENT DOCUMENTS

| 2005/0046402 A1 | 3/2005 | Kameda et al. ............... 323/282 |
| 2013/0279219 A1 | 10/2013 | Oki ................................. 363/53 |

(Continued)

FOREIGN PATENT DOCUMENTS

| JP | S54-063315 A | 5/1979 |
| JP | S54-063316 A | 5/1979 |

(Continued)

OTHER PUBLICATIONS

International Search Report dated Jul. 16, 2019 in corresponding International Application No. PCT/JP2019/016863.
(Continued)

*Primary Examiner* — Rakesh B Patel
(74) *Attorney, Agent, or Firm* — Ostrolenk Faber LLP

(57) ABSTRACT

An adjustment circuit is connected between a power generation circuit that converts environmental energy into electric power and a power conversion circuit that converts the electric power generated by the power generation circuit into a desired form. The adjustment circuit includes a first circuit unit and a second circuit unit. The first circuit unit is configured to have an input connected to the power generation circuit and an output connected to the power conversion circuit. The second circuit unit is configured to have a connection point connected to the first circuit unit, a grounding point connected to a grounding electric potential, and a capacitor connected between the connection point and the grounding point. A magnitude of output resistance included in the second circuit unit is smaller than a magnitude of output resistance included in the power generation circuit.

(Continued)

The capacitor is charged with the electric power output from the power generation circuit and outputs the charged electric power to the power conversion circuit.

16 Claims, 21 Drawing Sheets

(51) Int. Cl.
*H02M 3/07* (2006.01)
*H03H 7/01* (2006.01)

(58) Field of Classification Search
USPC .......................................................... 333/124
See application file for complete search history.

(56) References Cited

U.S. PATENT DOCUMENTS

| | | |
|---|---|---|
| 2016/0293824 A1 | 10/2016 | Ueno et al. |
| 2018/0083530 A1 | 3/2018 | Ueno |

FOREIGN PATENT DOCUMENTS

| | | |
|---|---|---|
| JP | H07-230890 A | 8/1995 |
| JP | 2005-070595 A | 3/2005 |
| JP | 2013-229951 A | 11/2013 |
| JP | 2016-195476 A | 11/2016 |
| JP | 2018-046708 A | 3/2018 |

OTHER PUBLICATIONS

Chao Lu, Vijay Raghunathan, and Kaushik Roy, "Efficient Design of Micro-Scale Energy Harvesting Systems", *IEEE Journal on Emerging and Selected Topics in Circuits and Systems*, vol. 1, No. 3, Sep. 2011, pp. 254-266.

English translation of the International Preliminary Report on Patentability (Chapter II of the PCT) dated Oct. 22, 2020 with a copy of Notification from the International Bureau (Form PCT/IB/338) in corresponding PCT International Application No. PCT/JP2019/016863 in English.

(a)

(b)

(a)

(b)

(c)

IMPEDANCE ADJUSTMENT CIRCUIT, POWER CONVERSION ELEMENT, AND POWER SUPPLY ELEMENT

CROSS-REFERENCE TO RELATED APPLICATIONS

The present application is a 35 U.S.C. §§ 371 national phase conversion of International Application No. PCT/JP2019/016863, filed Apr. 19, 2019, which claims priority to Japanese Patent Application No. 2018-081478, filed Apr. 20, 2018, the contents of both of which are incorporated herein by reference. The PCT International Application was published in the Japanese language.

TECHNICAL FIELD

The present disclosure describes an impedance adjustment circuit, a power conversion element, and a power supply element.

BACKGROUND ART

Technologies for utilizing environmental energy that have not been used before are attracting attention. Technologies utilizing environmental energy are called energy harvesting. Non-Patent Literature 1 discloses a basic system relating to energy harvesting. The system disclosed in Non-Patent Literature 1 includes a micro energy transducer, a frequency converter, a control device, and an application unit. Environmental energy is converted into electric power by the micro energy transducer. This electric power is converted into a desired voltage and a desired frequency by the frequency converter. The application unit such as a sensor performs a desired operation by receiving electric power supplied from the frequency converter. The control device performs necessary control operations on such elements. Patent Literature 1 discloses a piezoelectric device for power generation. The technology of Patent Literature 1 focuses on the output resistance of the piezoelectric device for power generation. The technology of Patent Literature 1 adjusts the impedance for a load.

CITATION LIST

Patent Literature

[Patent Literature 1] Japanese Unexamined Patent Publication No. 2002-315362

Non-Patent Literature

[Non-Patent Literature 1] Chao Lu, Vijay Raghunathan, and Kaushik Roy, "Efficient Design of Micro-Scale Energy Harvesting Systems", IEEE JOURNAL ON EMERGING AND SELECTED TOPICS IN CIRCUITS AND SYSTEMS, (United States of America), IEEE, September, 2011, No. 3, Vol. 1, pp. 254-266.

SUMMARY OF INVENTION

Technical Problem

A power generation element used for energy harvesting has a low output voltage. Thus, the electric power of a power generation element is supplied to a power conversion element. The power conversion element converts the electric power of a power generation element into a required form of electric power. The transmission of electric power from a power generation element to a power conversion element is influenced by a relation between the impedance of the power generation element and the impedance of the power conversion element.

As illustrated in Patent Literature 1, a power generation element has a high output resistance. Thus, when electric power is transmitted from a power generation element to a power conversion element, it is difficult to maintain an open voltage. In other words, a voltage supplied to the power conversion element becomes lower than an open voltage of the power generation element. The output voltage of the power generation element is low. As a result, there is a likelihood of a voltage supplied to the power conversion element being below an operating voltage of the power conversion element. Thus, there may be a case in which the power generation element is unable to supply desired electric power.

This, the present disclosure will describe an impedance adjustment circuit enabling transmission of electric power having high efficiency and a power conversion element and a power supply element capable of providing desired electric power.

Solution to Problem

One form of the present disclosure is an impedance adjustment circuit connected between a power generation circuit that converts external energy into electric power and outputs the electric power and a power conversion circuit that converts the electric power generated by the power generation circuit into a desired form. The impedance adjustment circuit includes a first circuit unit configured to have an input port connected to the power generation circuit and an output port connected to the power conversion circuit and a second circuit unit configured to have a connection point connected to the first circuit unit, a grounding point connected to a grounding electric potential, and a capacitor connected between the connection point and the grounding point. A magnitude of an output resistance included in the second circuit unit is smaller than a magnitude of an output resistance included in the power generation circuit. The capacitor is charged with the electric power output from the power generation circuit and outputs the charged electric power to the power conversion circuit.

The capacitor of the second circuit unit of the impedance adjustment circuit of the present disclosure is charged with electric power received from the power generation circuit through the input port of the first circuit unit. The capacitor transmits electric power to the power conversion circuit through the output port of the first circuit unit.

According to this configuration, in a form in which electric power is transmitted to the power conversion circuit, the power source of the power conversion circuit is capacitor rather than a power generation circuit. The output resistance present between the capacitor and the output port is smaller than the output resistance of the power generation circuit. As a result, a circuit configuration in which the impedance adjustment circuit is connected between the power generation circuit and the power conversion circuit can inhibit a voltage drop in the electric power transmitted to the power conversion circuit better than a circuit configuration in which the power generation circuit is directly connected to the power conversion circuit. Therefore, according to the impedance adjustment circuit, electric power can be transmitted with a high efficiency.

In another form of the present disclosure, a power conversion element connected to a power generation element including a power generation circuit that converts external energy into electric power and outputs the electric power is provided. The power conversion element includes a power conversion circuit configured to convert the electric power generated by the power generation circuit into a desired form and an impedance adjustment circuit configured to be connected between the power generation circuit and the power conversion circuit. The impedance adjustment circuit includes: a first circuit unit configured to have an input port connected to the power generation circuit and an output port connected to the power conversion circuit; and a second circuit unit configured to have a connection point connected to the first circuit unit, a grounding point connected to a grounding electric potential, and a capacitor connected between the connection point and the grounding point. A magnitude of output resistance included in the second circuit unit is smaller than a magnitude of output resistance included in the power generation circuit. The capacitor is charged with the electric power output from the power generation circuit and outputs the charged electric power to the power conversion circuit.

The power conversion element of this other form includes the impedance adjustment circuit described above. Therefore, the circuit configuration of the power conversion element can inhibit a voltage drop in the electric power transmitted to the power conversion circuit better than a circuit configuration in which the power generation circuit is directly connected to the power conversion circuit. Therefore, the power conversion element can transmit electric power with a high efficiency.

A power conversion element according to another form may further include a control unit configured to start and stop an operation of the power conversion circuit. The power conversion element may charge the capacitor by stopping the operation of the power conversion circuit. In addition, the power conversion element may discharge the capacitor by starting the operation of the power conversion circuit. According to this configuration, the configuration of the impedance adjustment circuit can be simplified.

In another form, the control unit may control starting of the operation and stopping of the operation of the power conversion circuit on the basis of a magnitude of a voltage supplied from the impedance adjustment circuit to the power conversion circuit. According to this configuration, desired electric power can be reliably acquired from the power conversion circuit.

In another form, the control unit may perform mutual switching between starting of the operation and stopping of the operation of the power conversion circuit every time a predetermined time elapses. According to this configuration, the impedance adjustment circuit can be controlled in a simplified manner.

In another form, the first circuit unit may have a first switch connected to the input port and a second switch connected to the first switch and the output port. The second circuit unit may have a connection point connected to the first switch and the second switch and a capacitor connected to the connection point and the grounding point. The power conversion element may further include a control unit configured to control the first switch and the second switch. The control unit may perform mutual switching between a charging operation of connecting the input port to the capacitor by controlling the first switch and disconnecting the output port from the capacitor by controlling the second switch and a discharging operation of disconnecting the input port from the capacitor by controlling the first switch and connecting the output port to the capacitor by controlling the second switch. According to this configuration, switching between the charging operation and the discharging operation can be reliably performed.

In another form, the control unit may control operations of the first switch and the second switch on the basis of a magnitude of a voltage supplied from the impedance adjustment circuit to the power conversion circuit. According to this configuration, desired electric power can be reliably obtained from the power conversion circuit.

In another form, the control unit may control operations of the first switch and the second switch every time a predetermined time elapses. According to this configuration, the impedance adjustment circuit can be controlled in a simplified manner.

In another form, the power conversion element further includes: a first power conversion circuit as the power conversion circuit described above; a second power conversion circuit other than the first power conversion circuit configured to convert the electric power generated by the power generation circuit into a desired form; and a control unit configured to control operations of the first power conversion circuit and the second power conversion circuit. The second power conversion circuit is disposed in parallel with the impedance adjustment circuit and the first power conversion circuit. An input impedance of the second power conversion circuit is closer to an output impedance of the power generation circuit than an input impedance of the first power conversion circuit. The control unit obtains electric power from the first power conversion circuit after obtaining electric power from the second power conversion circuit.

A power generation element according to a yet another form of the present disclosure includes: a power generation circuit configured to convert external energy into electric power and output the electric power; a power conversion circuit configured to convert the electric power generated by the power generation circuit into a desired form; and an impedance adjustment circuit connected between the power generation circuit and the power conversion circuit. The impedance adjustment circuit has: a first circuit unit configured to have an input port connected to the power generation circuit and an output port connected to the power conversion circuit; and a second circuit unit configured to have a connection point connected to the first circuit unit, a grounding point connected to a grounding electric potential, and a capacitor connected between the connection point and the grounding point. A magnitude of output resistance included in the second circuit unit is smaller than a magnitude of output resistance included in the power generation circuit. The capacitor is charged with the electric power output from the power generation circuit and outputs the charged electric power to the power conversion circuit.

The power generation element according to the yet another form includes the impedance adjustment circuit described above. The power generation element can inhibit a voltage drop in electric power transmitted to the power conversion circuit better than the configuration in which a power generation circuit is directly connected to a power conversion circuit. As a result, electric power is transmitted from the power generation circuit to the power conversion circuit with a high efficiency. Therefore, the power generation element can supply desired electric power.

Advantageous Effects of Invention

An impedance adjustment circuit of the present disclosure can efficiently transmit electric power from a power generation element to a power conversion element. A power conversion element and a power supply element of the present disclosure can provide desired electric power.

Figure 12:
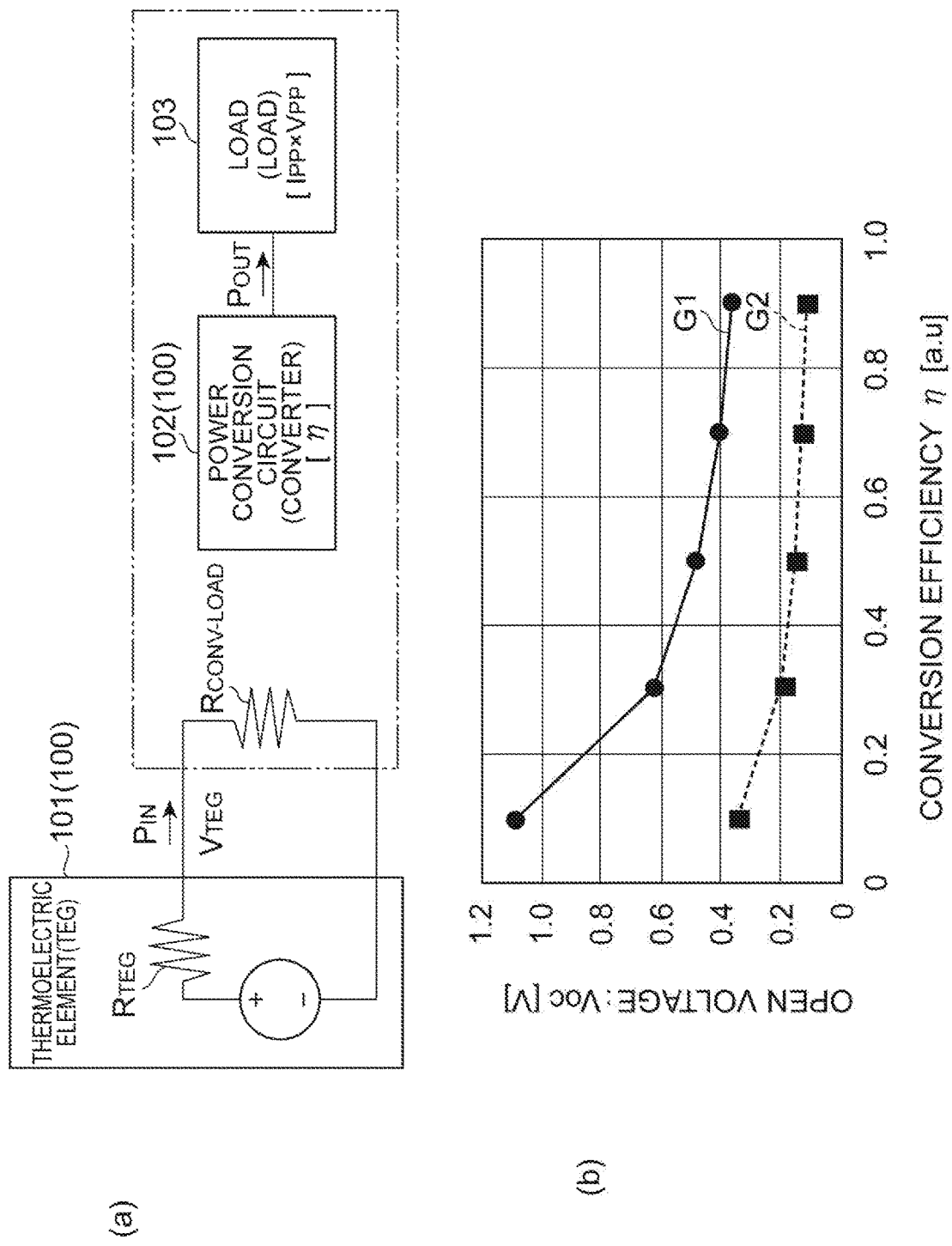

Part (a) of FIG. 12 is a diagram illustrating the configuration of a power supply element of Examination Case 1. Part (b) of FIG. 12 is a graph illustrating a result of Examination Case 1.

Figure 13:
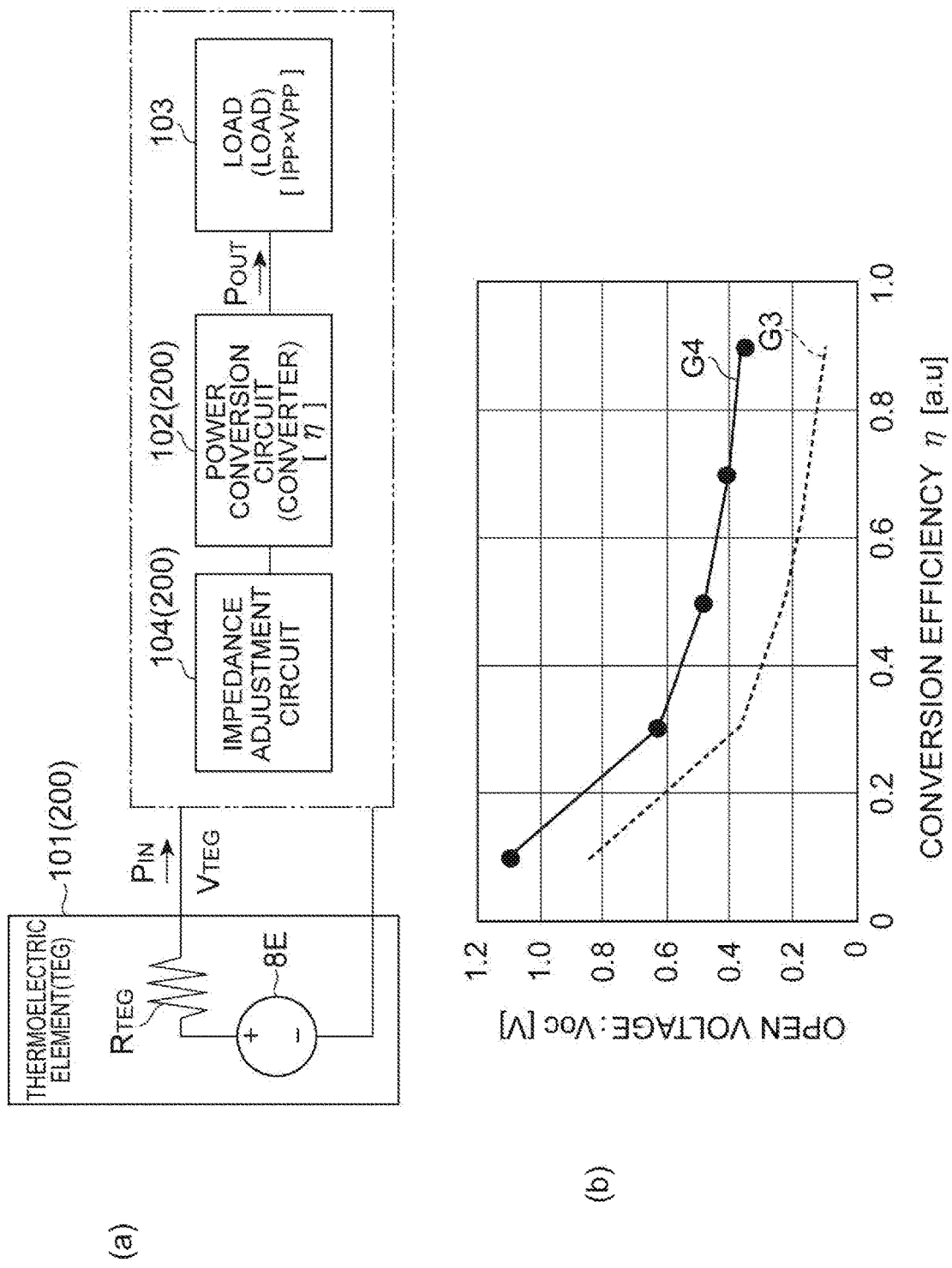

Part (a) of FIG. 13 is a diagram illustrating the configuration of a power supply element of Examination Case 2. Part (b) of FIG. 13 is a graph illustrating a result of Examination Case 2.

Figure 14:
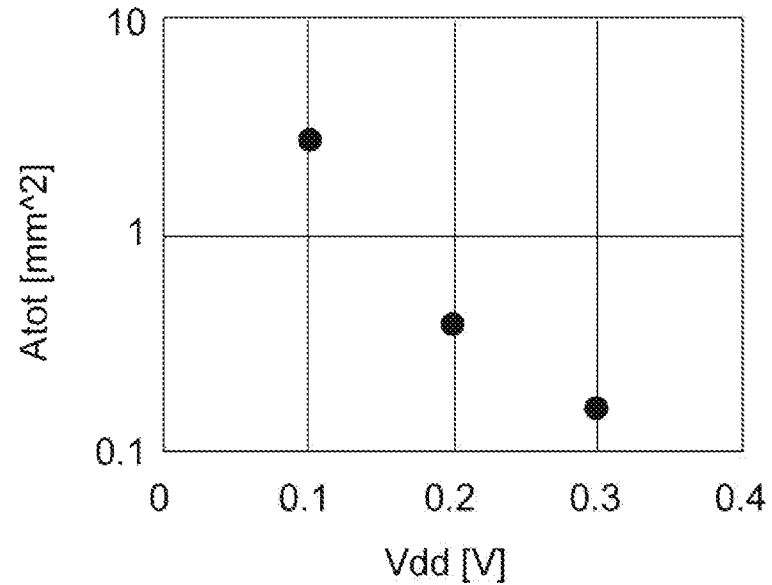
Figure 14:
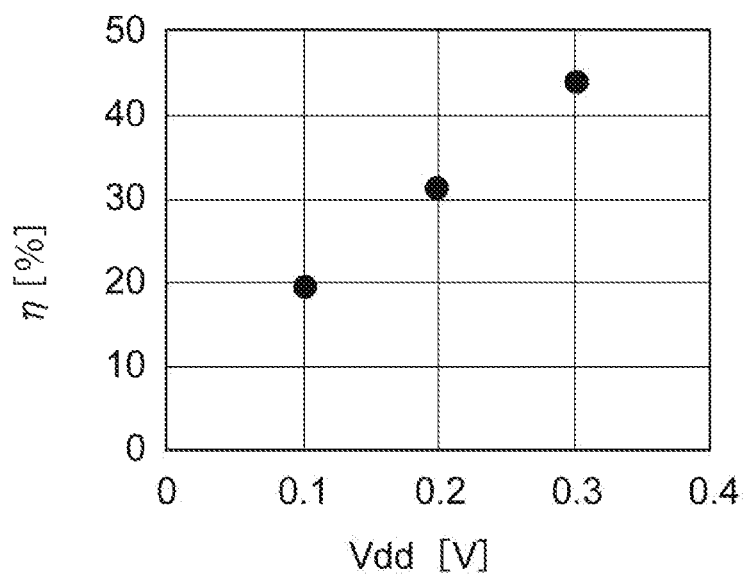

FIG. 14 is a graph illustrating a result of Examination Case 3.

Figure 15:
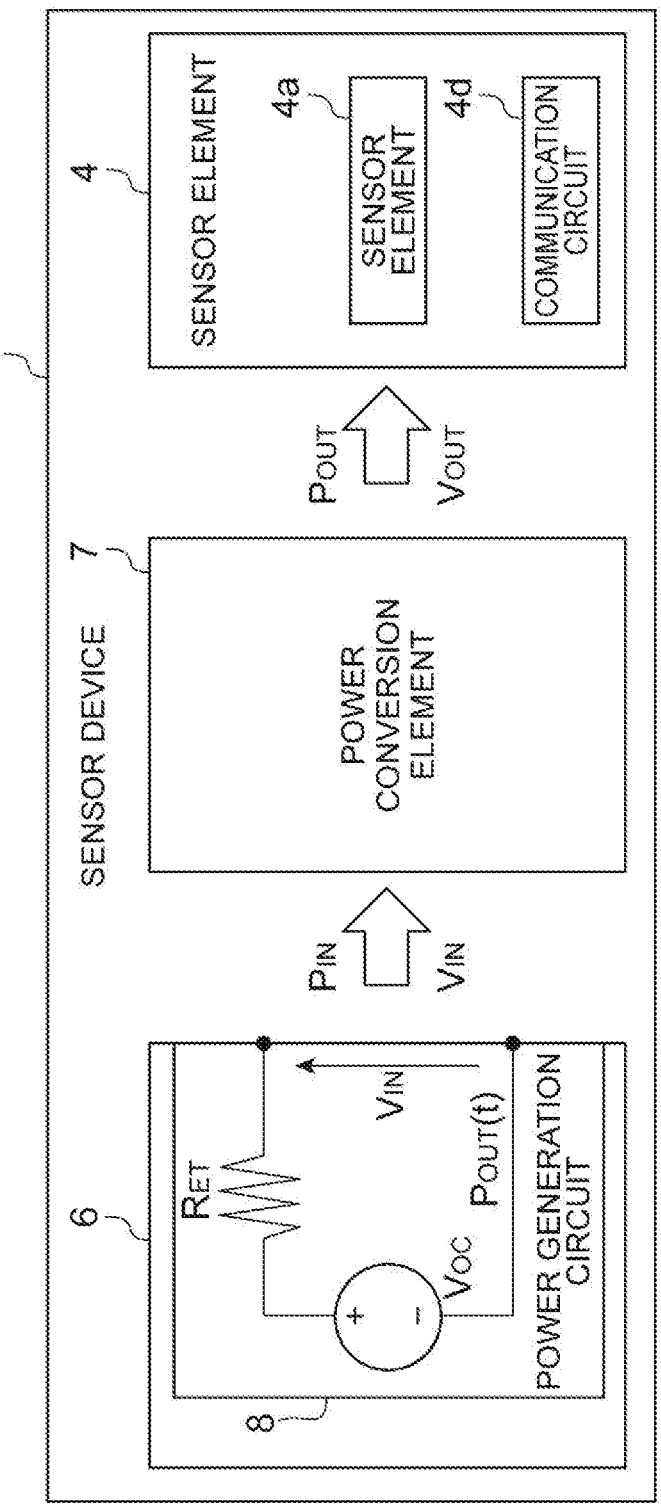

FIG. 15 is a diagram illustrating the configuration of a sensor device for illustrating a background of Modified Example 8.

Figure 16:
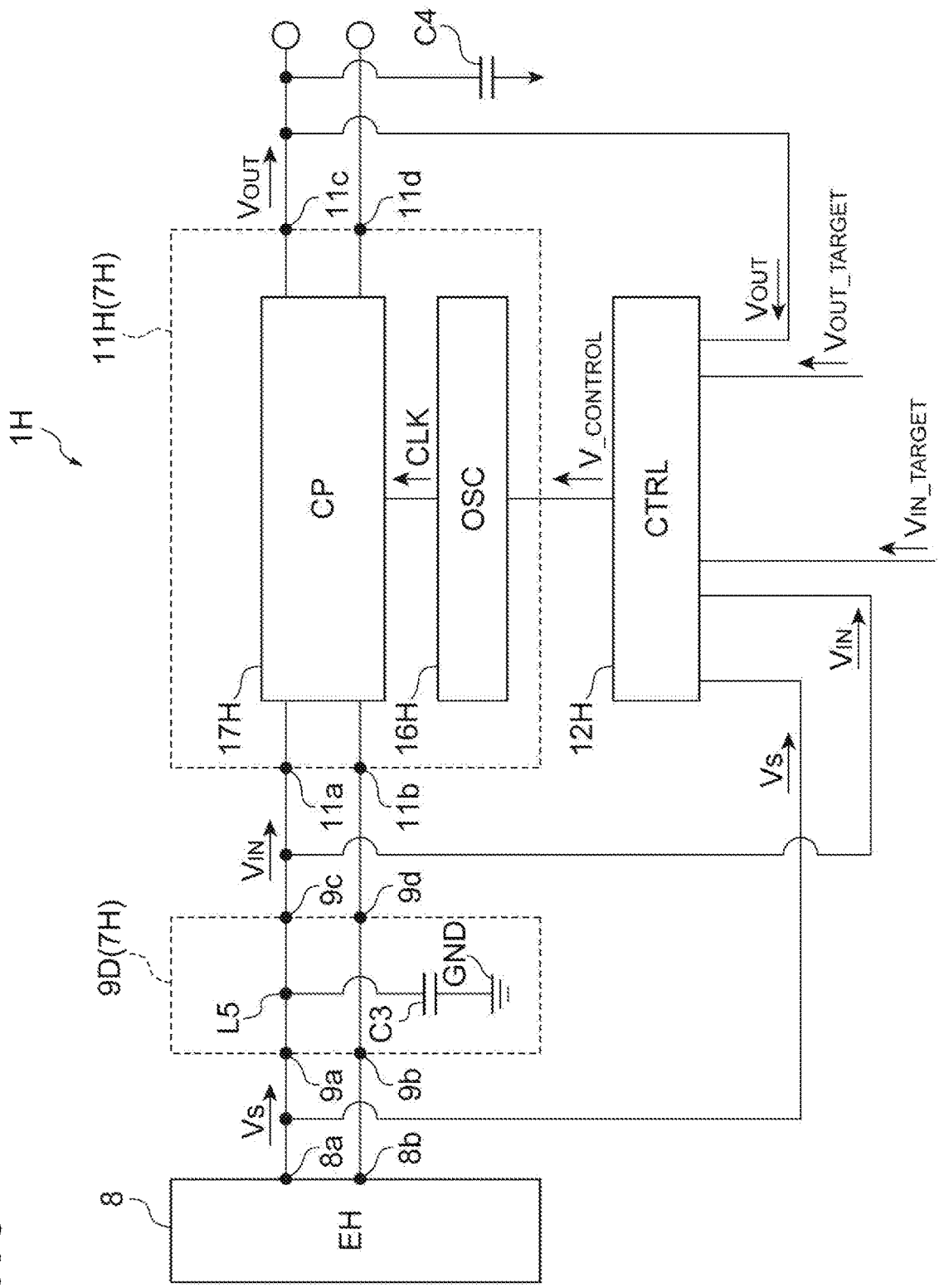

FIG. 16 is a diagram illustrating the configuration of a power supply element of Modified Example 8.

Figure 17:
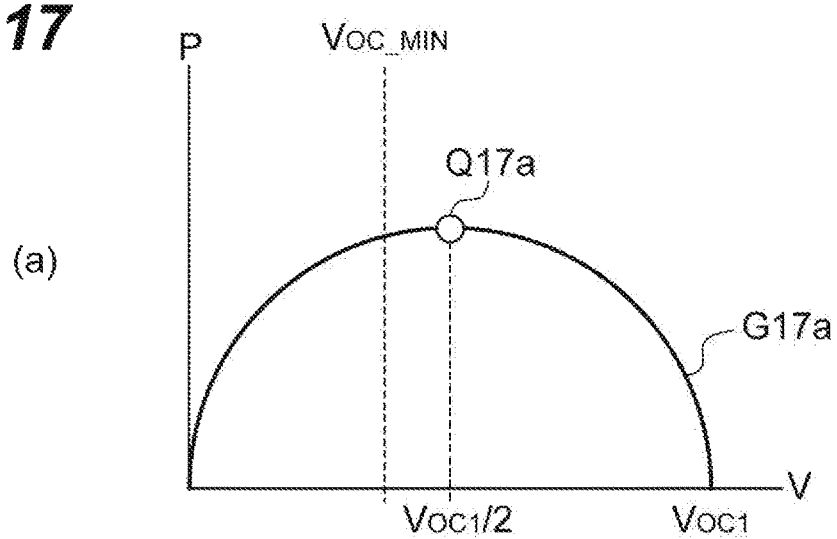
Figure 17:
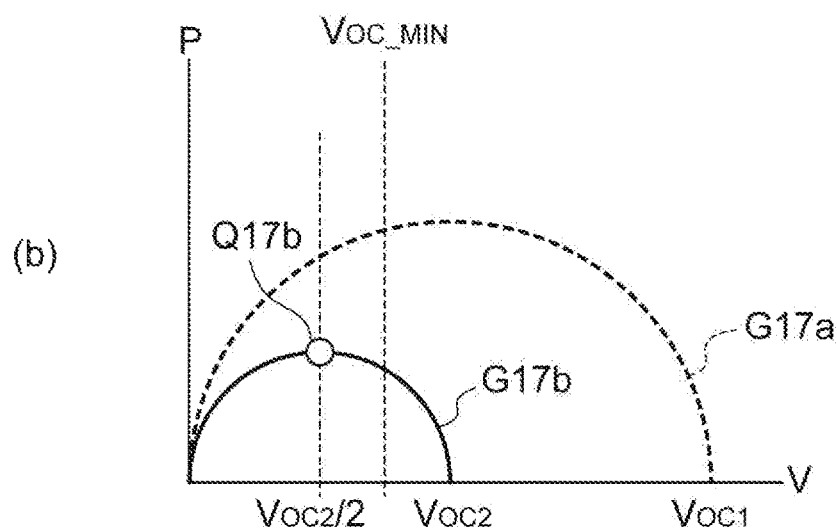
Figure 17:
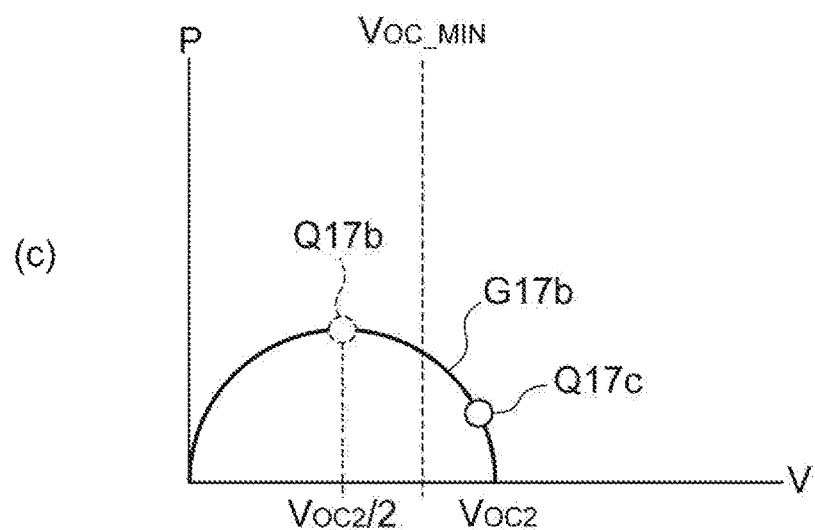

Part (a) of FIG. 17, Part (b) of FIG. 17, and Part (c) of FIG. 17 are diagrams illustrating operations of the power supply element of Modified Example 8.

Figure 18:
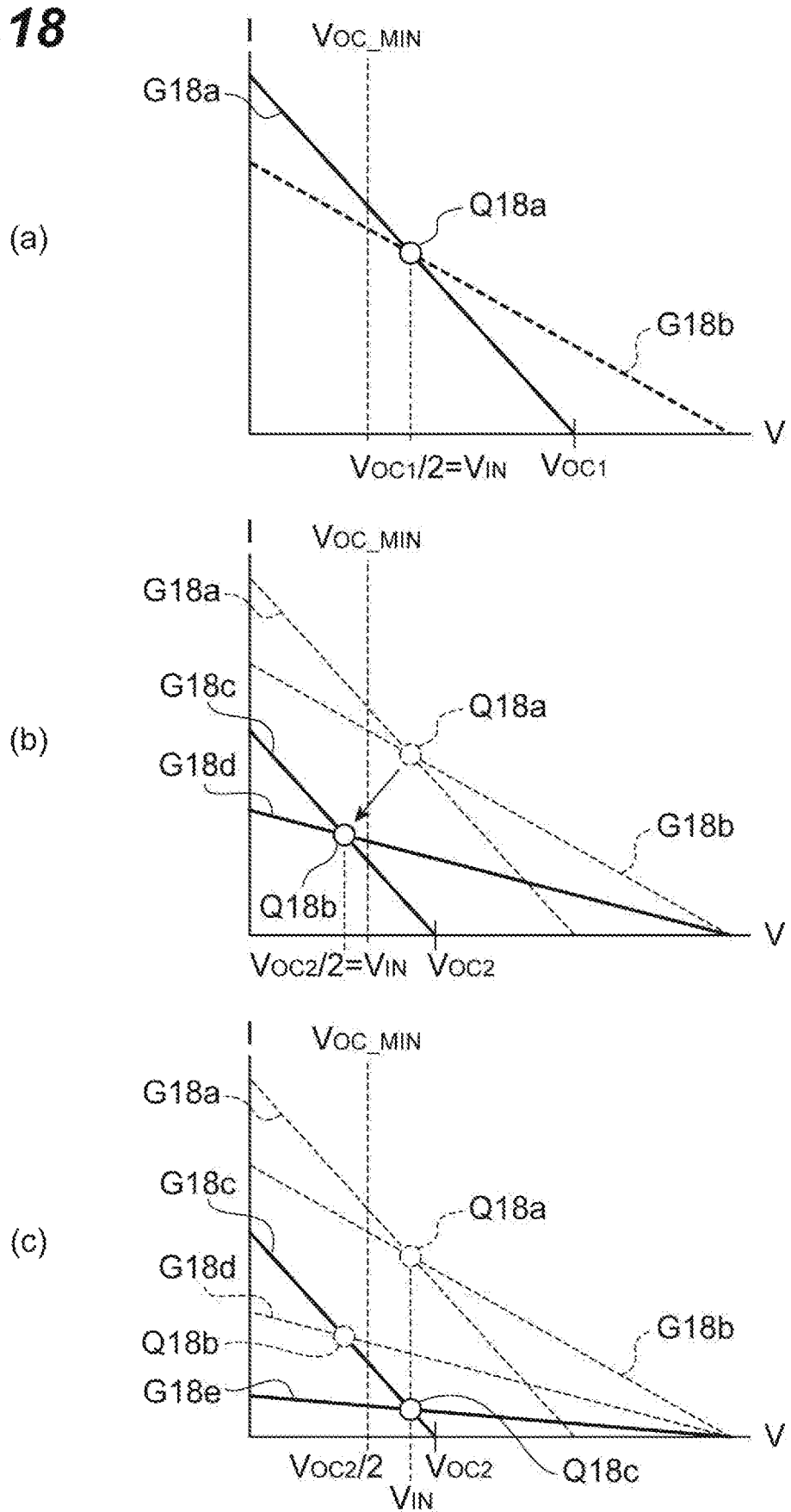

Part (a) of FIG. 18, Part (b) of FIG. 18, and Part (c) of FIG. 18 are diagrams illustrating operations of the power supply element of Modified Example 8.

Figure 19:
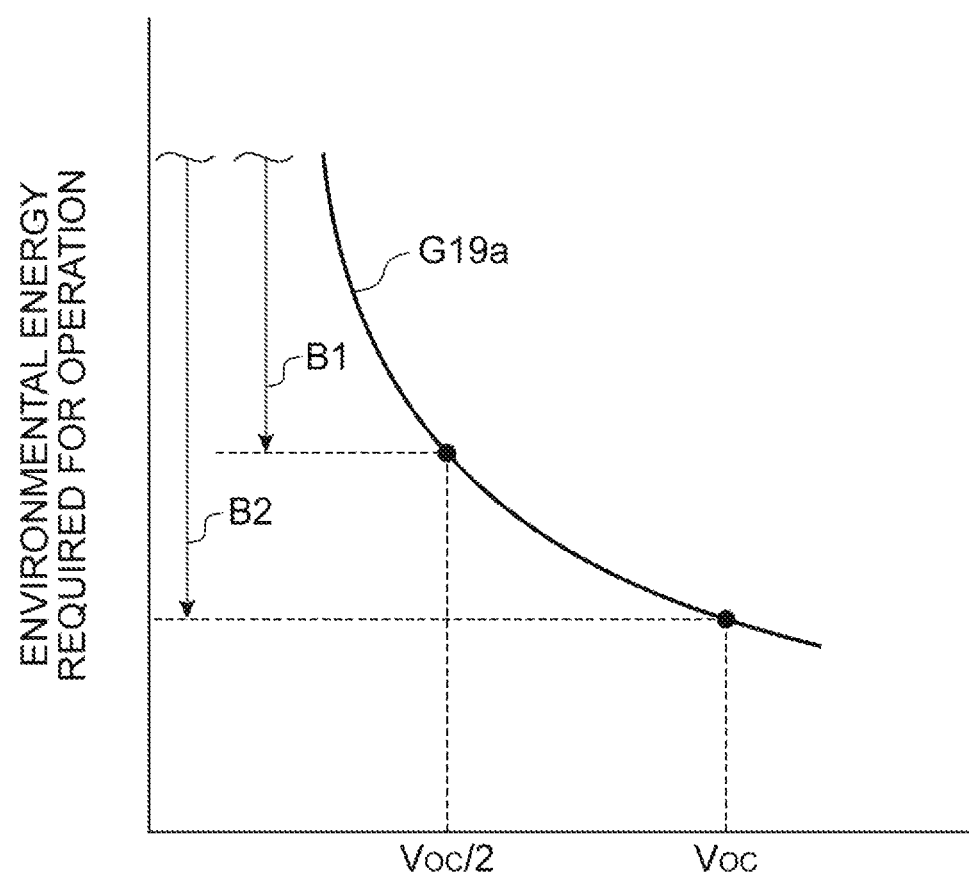

FIG. 19 is a diagram illustrating effects of the power supply element of Modified Example 8.

Figure 20:
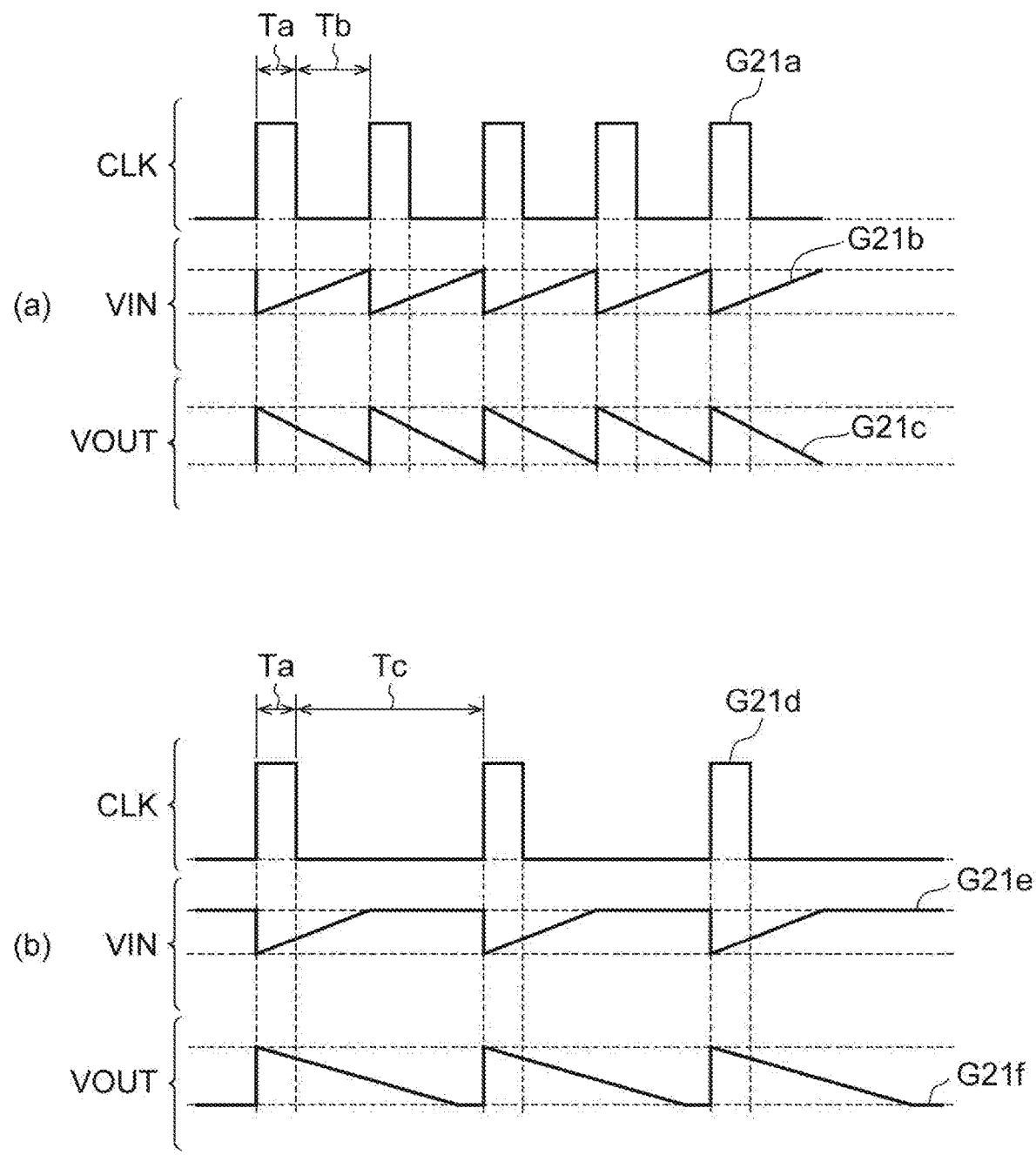

Part (a) of FIG. 20 and Part (b) of FIG. 20 are diagrams illustrating operations of the power supply element of Modified Example 8.

Figure 21:
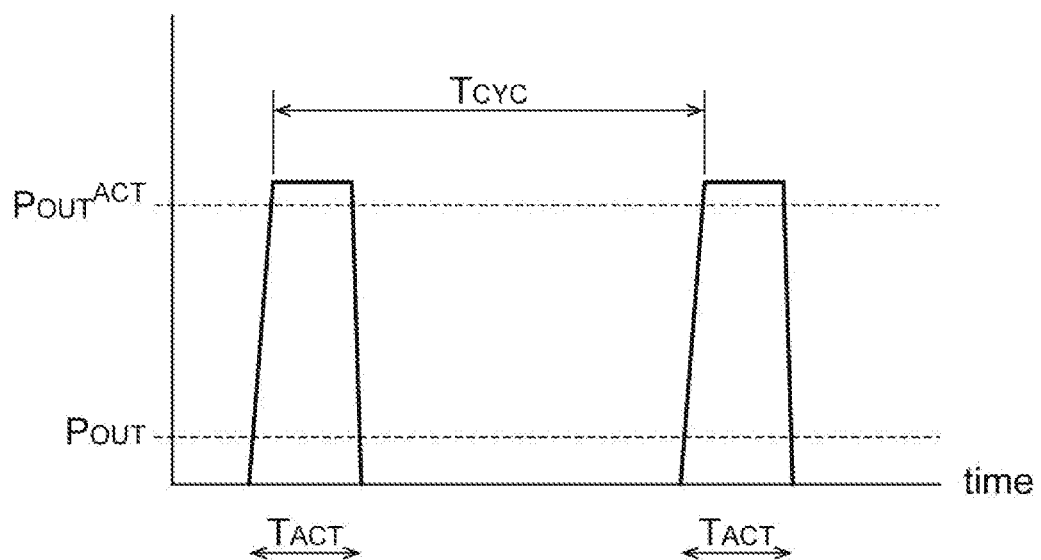

FIG. 21 is a diagram illustrating effects of the power supply element of Modified Example 8.

DESCRIPTION OF EMBODIMENTS

Hereinafter, an embodiment for performing the present invention will be described in detail with reference to the attached drawings. In description of the drawings, the same reference signs will be assigned to the same elements, and duplicate description will be omitted.

Figure 1:
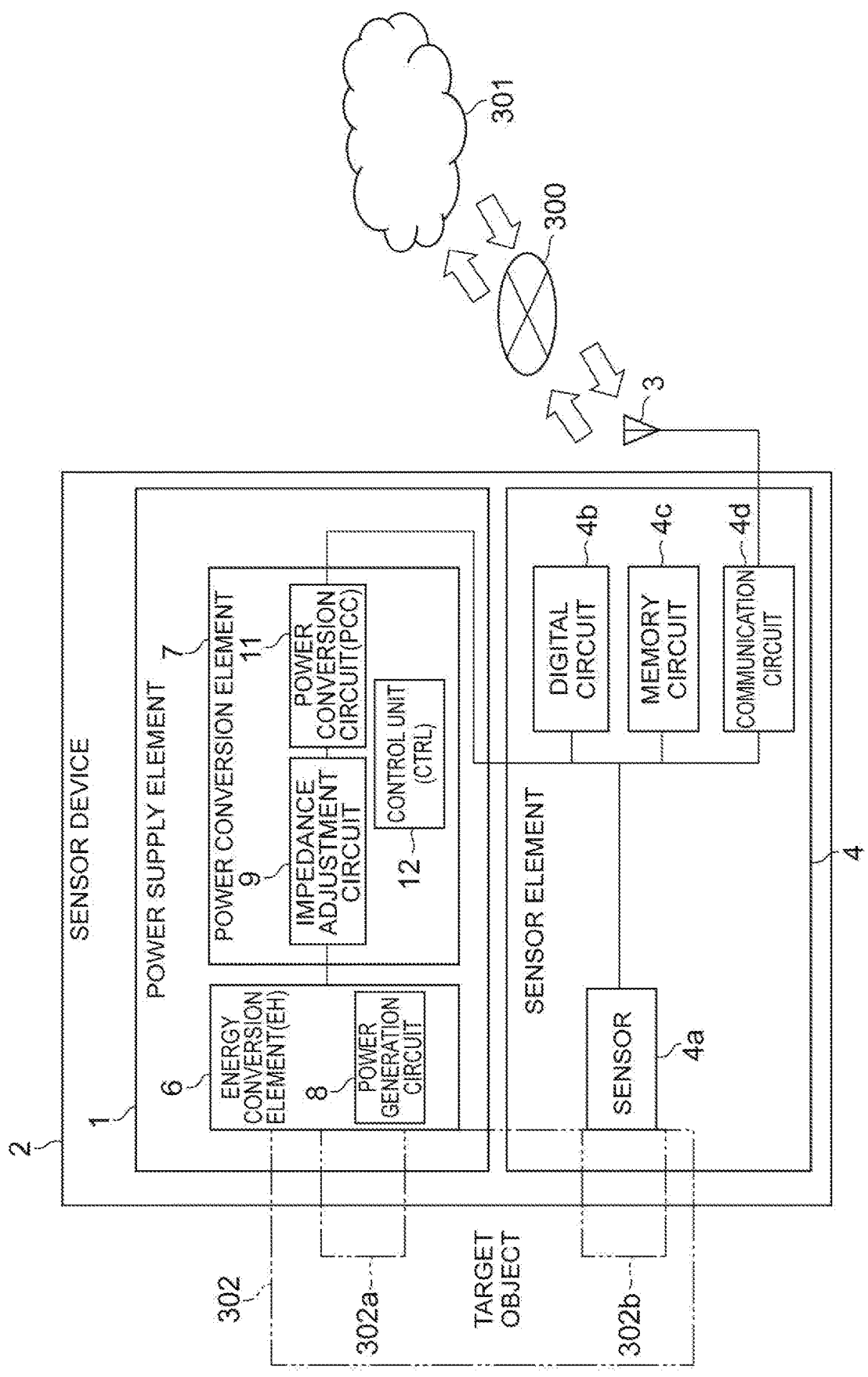
FIG. 1 is a diagram illustrating the configuration of a sensor device using a power supply element according to an embodiment.

As illustrated in FIG. 1, a power supply element 1 is used in a sensor device 2. The sensor device 2 configures a so-called Internet of Things (IoT).

The sensor device 2 is connected to the Internet 300 through an antenna 3. The sensor device 2 transmits collected data to another system such as a cloud 301 through the Internet 300. The sensor device 2 receives various kinds of data such as a measuring program through the Internet 300.

The sensor device 2 includes the power supply element 1 and a sensor element 4. The sensor element 4 collects various kinds of data. In various kinds of data, for example, a temperature, a humidity, or a vibration frequency of a target object 302 is included. The sensor element 4 transmits data. In addition, the sensor element 4 receives data from the outside. For example, the sensor element 4 includes a sensor 4a, a digital circuit 4b, a memory circuit 4c, and a communication circuit 4d.

The power supply element 1 supplies electric power used for driving the sensor element 4. The power supply element 1 supplies electric power that is necessary for operations of the sensor 4a, the digital circuit 4b, the memory circuit 4c, and the communication circuit 4d configuring the sensor element 4. The power supply element 1 is not a device that stores electric power in advance such as a so-called battery. The power supply element 1 obtains electric power, for example, by converting external energy such as vibration energy supplied from the target object 302. Thus, when vibration energy is supplied from the target object 302, the power supply element 1 continues to supply electric power to the sensor device 2. The type of vibrations that become an energy source may be any type. For example, the vibrations that become an energy source may be sinusoidal vibrations. In addition, the vibrations that become an energy source may be random vibrations. The sensor device 2 installed in the target object 302 continues to supply electric power using vibration energy of the target object 302. Therefore, in the sensor device 2, a battery does not need to be replaced.

In addition, the target object 302 may include a target object 302b that is independent from target objects 302a and 302a. The target object 302a may supply external energy to the power supply element 1. The target object 302b may be measured by the sensor 4a.

The power supply element 1 includes an energy conversion element 6 (a power generation element) and a power conversion element 7. The energy conversion element 6 converts external energy supplied from the target object 302 into electric power. The power conversion element 7 converts electric power supplied from the energy conversion element 6 into electric power that can be used for driving the sensor element 4.

Figure 2:
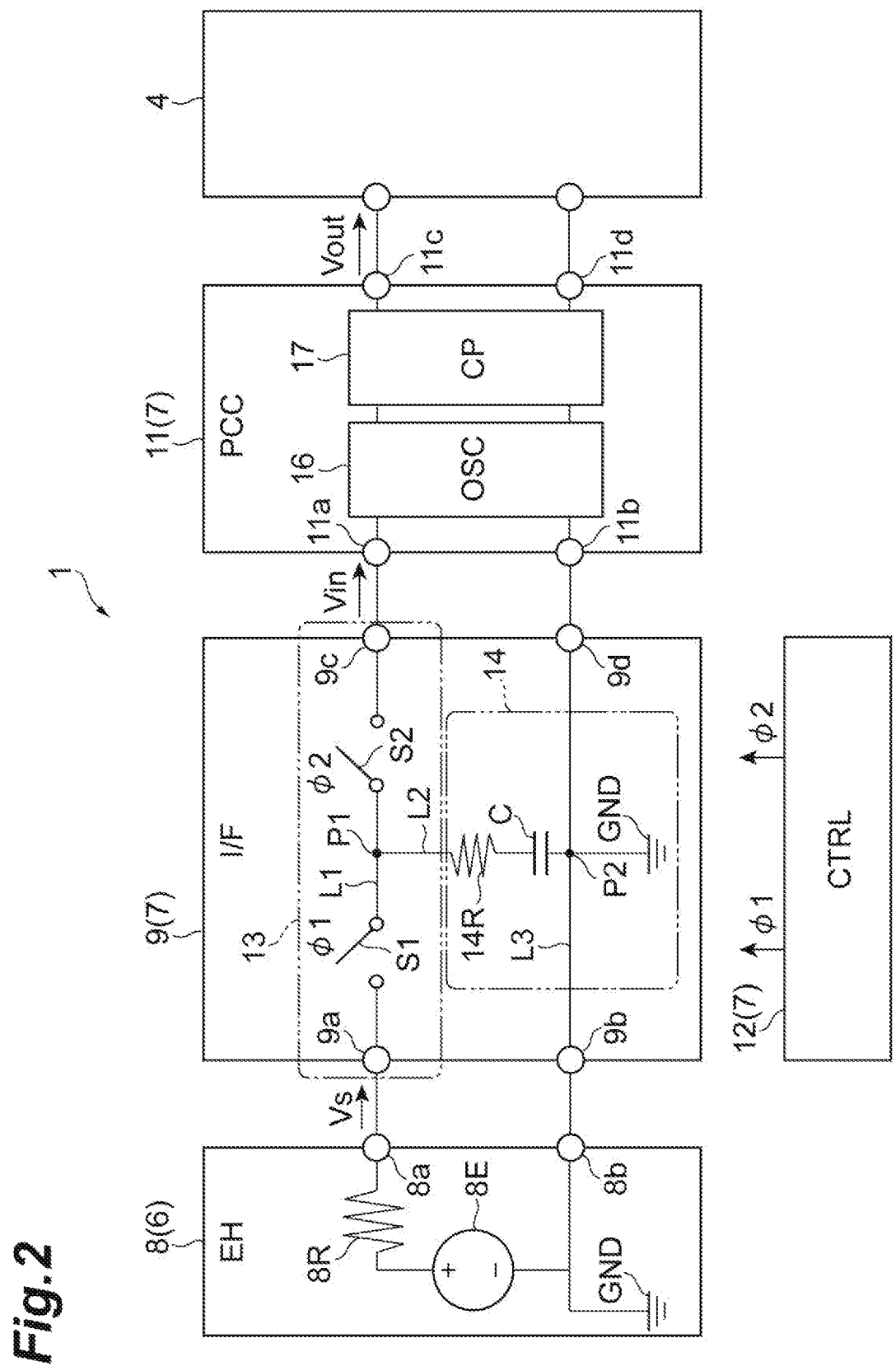
FIG. 2 is a diagram illustrating the configuration of a power supply element.

As illustrated in FIG. 2, the energy conversion element 6 includes a power generation circuit 8. The power generation circuit 8 includes outputs 8a and 8b, a power generation unit 8E, and an output resistor 8R. The power generation unit 8E is connected to the output resistor 8R and a grounding electric potential GND. The output resistor 8R is connected to the power generation unit 8E and the output 8a.

The power generation unit 8E accepts energy supplied from the target object 302. The power generation unit 8E generates electric power using the accepted energy. The electric power is supplied to the output 8a. For example, the power generation unit 8E may use a piezoelectric phenomenon in which vibrations are converted into electric power. The power generation unit 8E includes a vibrator such as a cantilever. A resonance frequency of the vibrator is adjusted to a vibration frequency of the target object 302. The power generation unit 8E generates AC power. A frequency of the AC power corresponds to a frequency at which the vibrator actually vibrates. In other words, the frequency of the AC power output from the power generation unit 8E corresponds to the frequency of the vibrator. The frequency of the AC power output from the power generation unit 8E corresponds to the vibration frequency of the target object 302. For example, the frequency of the AC power is equal to or higher than several hundred hertz and is equal to or lower than several megahertz.

The power conversion element 7 is electrically connected to the energy conversion element 6. The power conversion element 7 is electrically connected to the sensor element 4.

The power conversion element 7 includes an impedance adjustment circuit (hereinafter, referred to as "adjustment circuit 9"), a power conversion circuit 11, and a control unit 12. The adjustment circuit 9 is connected to the energy conversion element 6 and the power conversion circuit 11. The control unit 12 controls operations of the power conversion circuit 11 and the adjustment circuit 9.

The adjustment circuit 9 is connected to the power generation circuit 8 and the power conversion circuit 11. The adjustment circuit 9 adjusts the impedance of a circuit configuration that connects the power conversion circuit 11 to the power generation circuit 8.

The adjustment circuit 9 includes an input 9a (an input port), an input 9b, an output 9c (an output port), and an output 9d. The input 9a is connected to the output 8a of the power generation circuit 8. The input 9b is connected to the output 8b of the energy conversion element 6. The outputs 9c and 9d are connected to the power conversion circuit 11.

Between the input 9a and the output 9c, a switch S1 (a first switch) and a switch S2 (a second switch) are disposed. The switch S1 is connected to the input 9a and the switch S2. The switch S2 is connected to the switch S1 and the output 9c. The input 9a, the output 9c, and the switches S1 and S2 configure a first circuit unit 13. The switches S1 and S2 are connected to a capacitor C. A line L1 connecting the switch S1 to the switch S2 has a connection point P1. A line L2 connected to the capacitor C is connected to the connection point P1.

The input 9b is connected to the output 9d. A line L3 connecting the input 9b to the output 9d has a grounding point P2. The grounding point P2 is connected to one end of the capacitor C. Thus, reference electric potential (GND) is supplied to the input 9b, the output 9d, and one end of the capacitor C. The connection point P1, the grounding point P2, and the capacitor C configure a second circuit unit 14.

The capacitance of the capacitor C, for example, is set on the basis of a magnitude of an open voltage of the power generation circuit 8, the electric power required by the power conversion circuit 11, the electric power required by the sensor element 4, and the like. For example, the capacitance of the capacitor C may be 10 μF.

The power conversion circuit 11 converts the electric power output from the adjustment circuit 9 into electric power according to the specifications of the sensor element 4. More specifically, a voltage of the electric power output from the power conversion circuit 11 is higher than a voltage of the electric power output from the adjustment circuit 9. In other words, the power conversion circuit 11 boosts the voltage.

The power conversion circuit 11 includes inputs 11a and 11b and outputs 11c and 11d. The input 11a is connected to the output 9c of the adjustment circuit 9. The input 11b is connected to the output 9d of the adjustment circuit 9. The outputs 11c and 11d are connected to the sensor element 4.

The power conversion circuit 11 includes a frequency modulating unit 16 and a transformation unit 17. The frequency modulating unit 16 is connected to the inputs 11a and 11b. The frequency modulating unit 16 receives electric power from the adjustment circuit 9. The frequency modulating unit 16 generates a clock signal. The frequency modulating unit 16 superimposes a clock signal on an output voltage of the adjustment circuit 9. The frequency modulating unit 16 may employ a ring oscillator. The ring oscillator, for example, includes a NAND circuit and an inverter circuit. A frequency of a clock signal generated by the frequency modulating unit 16 may be equal to or higher than several megahertz. The frequency of the clock signal may be equal to or higher than several gigahertz.

The frequency modulating unit 16 is further connected to the transformation unit 17. The frequency modulating unit 16 supplies a voltage on which a clock signal is superimposed to the transformation unit 17.

The transformation unit 17 is connected to the frequency modulating unit 16. The transformation unit 17 receives a voltage on which a clock signal is superimposed. The transformation unit 17 boosts the voltage on which the clock signal is superimposed. For example, the transformation unit 17 may employ a charge pump. The charge pump includes a plurality of diodes and a plurality of capacitors.

The transformation unit 17 is connected to the outputs 11c and 11d. The transformation unit 17 supplies electric power based on the boosted voltage to the outputs 11c and 11d.

The control unit 12 generates control signals φ1 and φ2 used for the switches S1 and S2 of the adjustment circuit 9. The control unit 12 is connected to the adjustment circuit 9. The control unit 12 supplies the control signals φ1 and φ2 to the switches S1 and S2. The control signal φ1 is supplied to the switch S1. The control signal φ2 is supplied to the switch S2.

Hereinafter, operations of the adjustment circuit 9 and the control unit 12 will be described in detail.

Figure 3:
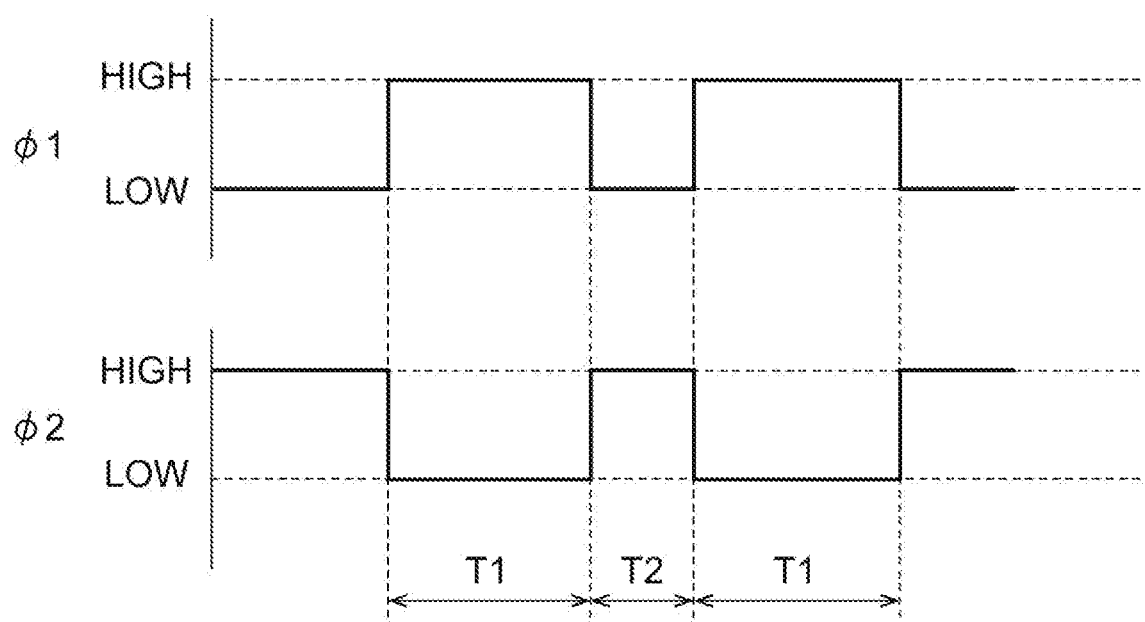
FIG. 3 is an example of a timing diagram of a power supply element.

The control unit 12 supplies a control signal used for a charging operation to the adjustment circuit 9. More specifically, the control unit 12 sets the control signal φ1 to HIGH and sets the control signal φ2 to LOW (see a period T1 illustrated in FIG. 3). The adjustment circuit 9 that has received the control signal φ1 (H) closes the switch S1. In other words, the input 9a is connected to the capacitor C. As a result, the capacitor C is charged using electric power generated by the power generation circuit 8. In addition, the adjustment circuit 9 that has received the control signal φ2 (L) opens the switch S2. In other words, the output 9c is disconnected from the capacitor C. As a result, no electric power is supplied to the output 9c. The power conversion circuit 11 is separated from the adjustment circuit 9. In other words, the power conversion circuit 11 is separated from the power generation circuit 8. Thus, in a charging operation, the power conversion circuit 11 does not output electric power.

After a predetermined time elapses from a timing at which a control signal for a charging operation is supplied, the control unit 12 supplies a control signal used for a discharging operation to the adjustment circuit 9. More specifically, the control unit 12 sets the control signal φ1 to LOW and sets the control signal φ2 to HIGH (see a period T2 illustrated in FIG. 3). The adjustment circuit 9 that has received the control signal φ1 (L) opens the switch S1. In other words, the input 9a is disconnected from the capacitor C. As a result, the power generation circuit 8 is separated from the adjustment circuit 9. In other words, the power generation circuit 8 is separated from the power conversion circuit 11. The adjustment circuit 9 that has received the control signal φ2 (H) closes the switch S2. In other words, the output 9c is connected to the capacitor C. In other words, the adjustment circuit 9 is connected to the power conversion circuit 11. As a result, a voltage is supplied from the capacitor C to the output 9c. In this state, the impedance (the output resistance 8R) of the power generation circuit 8 has no influence on the power conversion circuit 11. Thus, the power conversion circuit 11 can receive a voltage that is close to an open voltage of the power generation circuit 8. As a result, a voltage having a low influence (or no influence) of a voltage drop is supplied to the power conversion circuit 11. In accordance with this voltage, the power conversion circuit 11 starts an operation. Then, the power conversion circuit 11 outputs a boosted voltage.

In the description presented above, the control unit 12 sets the length of the period T1 of the charging operation and the length of the period T2 of the discharging operation in advance. In other words, the periods T1 and T2 are fixed times. For example, the period T1 of the charging operation is longer than the period T2 of the discharging operation. The power conversion circuit 11 performs power conversion only during the period T2 of the discharging operation. In other words, the power conversion circuit 11 supplies electric power to the output 11c only during the period T2 of the discharging operation.

When a discharging operation is performed, the power conversion circuit 11 is separated from the power generation circuit 8. Here, the adjustment circuit 9 includes switches S1 and S2 and a capacitor C. Thus, ideally, the adjustment circuit 9 may be regarded to have no output resistance. In an actual circuit configuration, an output resistance 14R is present. However, the output resistance 14R is extremely low. Thus, the output resistance 14R may be regarded as being zero. In FIG. 2, the output resistance 14R is illustrated. However, the adjustment circuit 9 does not have the output resistance 14R as a resistor. For example, the output resistance 14R illustrated in FIG. 2 explicitly represents a resistance component of a line connecting the capacitor C to the switch S2. Generally, such a resistance component is ignored. This connection configuration is a state in which a power supply of which an impedance is zero is connected to the power conversion circuit 11. Alternatively, the connection configuration may be a state in which a power supply of which an impedance is extremely low is connected to the power conversion circuit 11. Thus, in accordance with a relation between the impedances of a power supply (the adjustment circuit 9) and a load (the power conversion circuit 11), the voltage of the power supply does not drop. As a result, electric power can be efficiently supplied from the power generation circuit 8 to the power conversion circuit 11.

In other words, in order to operate the power conversion circuit 11, a predetermined current needs to be generated by supplying a predetermined voltage required by an integrated circuit that becomes a load of the power conversion circuit 11 to the integrated circuit. When the power generation circuit 8 is directly connected to the power conversion circuit 11, a voltage supplied to the power conversion circuit 11 is lowered in accordance with a high impedance (the output resistance 8R) of the power generation circuit 8. When this voltage drop is not present, a necessary output current may be able to be obtained. However, in accordance with the voltage drop, the output current markedly decreases. On the other hand, by using the adjustment circuit 9, an ideal state in which an impedance is zero can be realized. By using the adjustment circuit 9, electric power can be supplied to the power conversion circuit 11 in an ideal state. As a result, for example, a period (the period T2 illustrated in FIG. 3) in which the adjustment circuit 9 is connected to the power conversion circuit 11 is assumed to be set to 1/3 of a period (the period T1 illustrated in FIG. 3) in which the power generation circuit 8 is connected to the adjustment circuit 9. Also in this case, 1/3 of an output current not influenced by the voltage drop can be supplied to the power conversion circuit 11.

In other words, according to the adjustment circuit 9, even in a case in which the open voltage of the power generation circuit 8 is low, power conversion can be performed. Therefore, even in a case in which energy input to the power generation circuit 8 is low, the energy can be collected as electric power.

[Operations and Effects] The power conversion element 7 and the power supply element 1 include the adjustment circuit 9. The capacitor C of the adjustment circuit 9 is charged in accordance with electric power received from the power generation circuit 8 through the input 9a of the first circuit unit 13. The capacitor C supplies electric power to the power conversion circuit 11 through the output 9c of the first circuit unit 13. In the form in which electric power is supplied to the power conversion circuit 11, a power source of the power conversion circuit 11 is not the power generation circuit 8 but is the capacitor C. The output resistance 14R present between the capacitor C and the output 9c is smaller than the output resistance 8R of the power generation circuit 8. As a result, a circuit configuration in which the adjustment circuit 9 is connected between the power generation circuit 8 and the power conversion circuit 11 can inhibit a drop of a voltage supplied to the power conversion circuit 11 better than a circuit configuration in which the power generation circuit 8 is directly connected to the power conversion circuit 11. Therefore, electric power can be transmitted with a high efficiency.

In a case in which an amount of external energy (vibrations, heat, or the like) input to the power generation circuit 8 is minute, an amount of electric power output from the power generation circuit 8 is low. For example, in a power generation circuit using a temperature difference, in a case in which a temperature difference caused in the power generation circuit is smaller than a predetermined temperature difference, the electric power required by the power supply element cannot be supplied. On the other hand, the power supply element 1 according to an embodiment can supply electric power from the power generation circuit 8 to the power conversion circuit 11 without causing a voltage drop. Thus, a threshold value of external energy that is necessary for supplying electric power from the power supply element 1 to the sensor element 4 can be lowered.

The first circuit unit 13 includes the switch S1 connected to the input 9a and the switch S2 connected to the switch S1 and the output 9c. The second circuit unit 14 includes the connection point P1 and the capacitor C. The connection point P1 is connected to the switch S1 and the switch S2. The capacitor C is connected to the connection point P1 and the grounding point P2. The power supply element 1 further includes the control unit 12 that controls the switches S1 and S2. The control unit 12 performs switching between a charging operation and a discharging operation. In a charging operation, the input 9a is connected to the capacitor C by controlling the switch S1. In addition, in the charging operation, the output 9c is disconnected from the capacitor C by controlling the switch S2. In a discharging operation, the input 9a is disconnected from the capacitor C by controlling the switch S1. In addition, in the discharging operation, the output 9c is connected to the capacitor C by controlling the switch S2. According to this configuration, switching between the charging operation and the discharging operation can be reliably performed.

The control unit 12 controls operations of the switches S1 and S2 every time a predetermined time elapses. According to this configuration, the adjustment circuit 9 can be controlled in a simplified manner.

Although the embodiment of the present invention has been described, the present invention is not limited to the embodiment described above.

MODIFIED EXAMPLE 1

Figure 4:
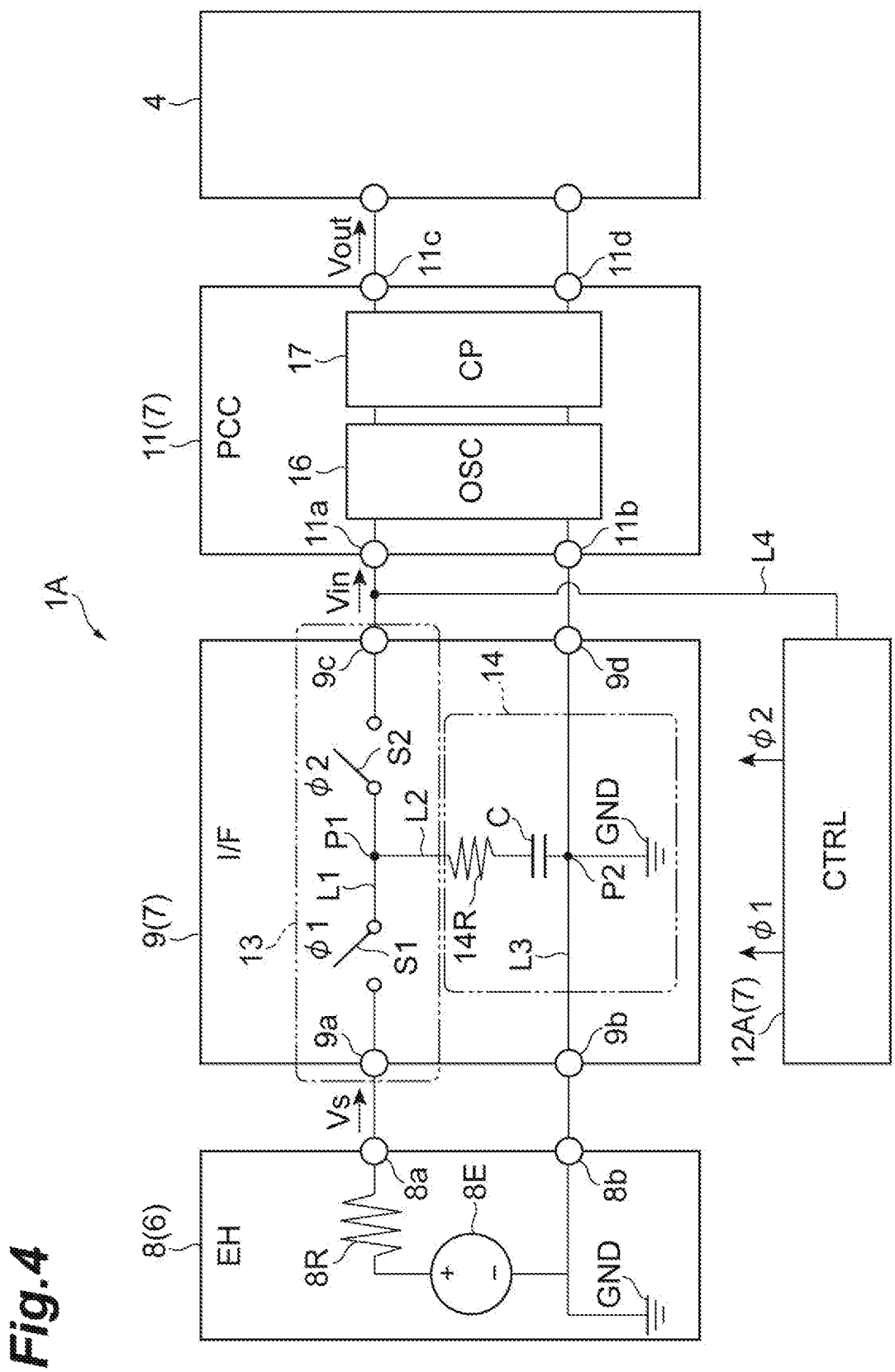
FIG. 4 is a diagram illustrating the configuration of a power supply element of Modified Example 1.

The control unit 12 has been described to regularly perform switching between a charging operation and a discharging operation every time a period set in advance elapses. A control unit 12A of a power supply element 1A of Modified Example 1 may perform control of switching between a charging operation and a discharging operation using a voltage supplied to the output 9c of the adjustment circuit 9. As illustrated in FIG. 4, the power supply element 1A of Modified Example 1 includes a line L4 that is connected to the output 9c of the adjustment circuit 9 in addition to the configuration of the power supply element 1 according to the embodiment. A voltage is supplied to the output 9c in accordance with a discharging operation. This voltage is lowered in accordance with elapse of a time. The control unit 12A monitors the voltage supplied to the output 9c. When the voltage supplied to the output 9c decreases by a predetermined proportion from a voltage at the time of starting a discharging operation as a reference, the control unit 12A switches from the discharging operation to a charging operation. For example, the voltage at the time of starting the discharging operation is set as 100%. When the voltage of the output 9c decreases to be 90% or less, the control unit 12A may perform switching from the discharging operation to the charging operation.

MODIFIED EXAMPLE 2

Figure 5:
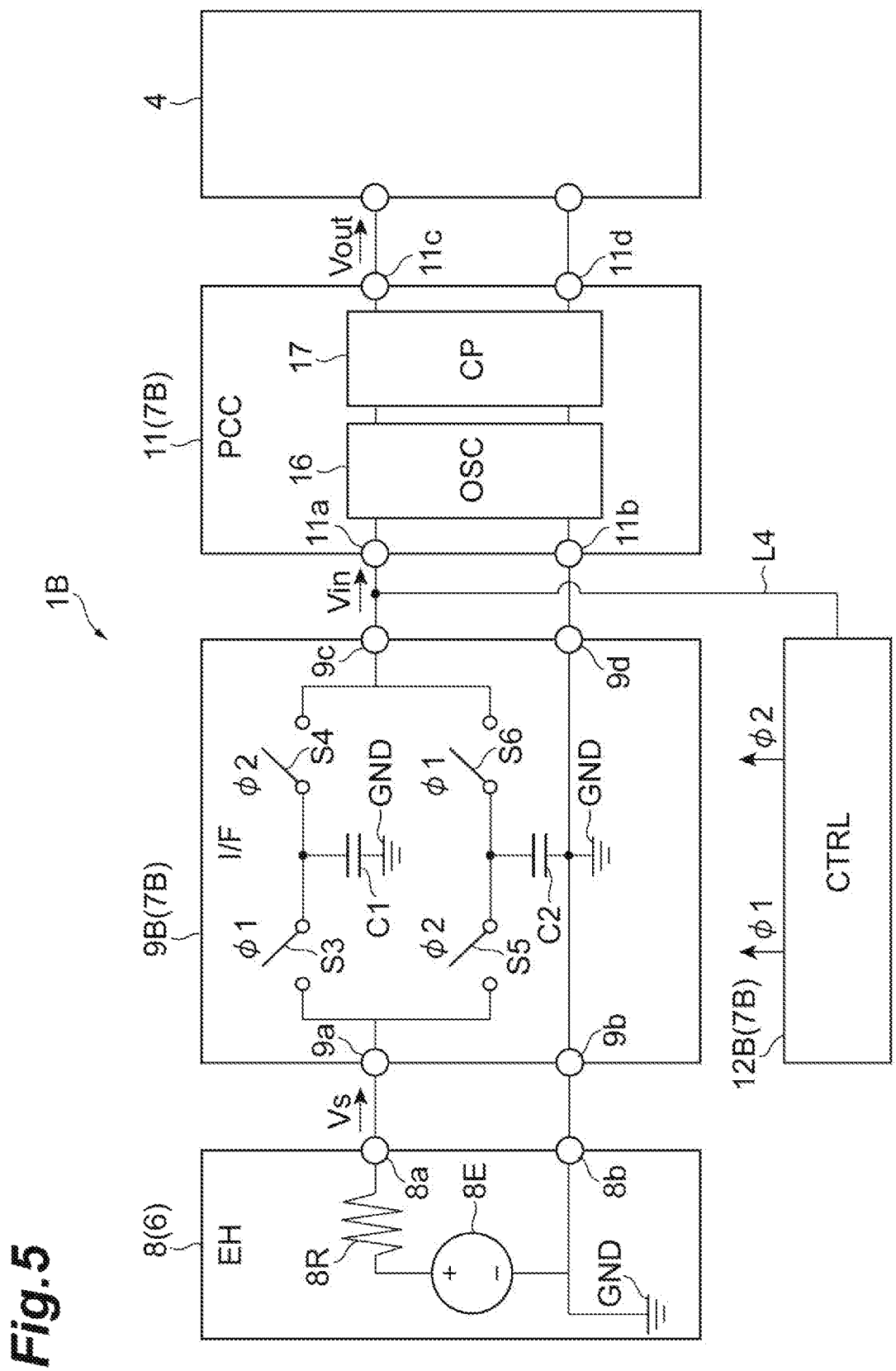
FIG. 5 is a diagram illustrating the configuration of a power supply element of Modified Example 2.

As illustrated in FIG. 5, a power supply element 1B of Modified Example 2 includes the power generation circuit 8, an adjustment circuit 9B, the power conversion circuit 11, and a control unit 12B. The adjustment circuit 9B, the power conversion circuit 11, and the control unit 12B configure a power conversion element 7B. The adjustment circuit 9B of Modified Example 2 includes four switches S3, S4, S5, and S6 and two capacitors C1 and C2. This configuration is acquired by connecting the adjustment circuit 9 in parallel.

More specifically, the switch S3 is connected to an input 9a, the switch S4, and the capacitor C1. The switch S4 is connected to the switch S3, the capacitor C1, and an output 9c. The capacitor C1 is connected to the switches S3 and S4 and the grounding electric potential GND. The switch S5 is connected to the input 9a, the switch S6, and the capacitor C2. The switch S6 is connected to the switch S5, the capacitor C2, and the output 9c. The capacitor C2 is connected to the switches S5 and S6 and the grounding electric potential GND. The switches S3 and S6 are controlled in accordance with a control signal φ1. On the other hand, the switches S4 and S5 are controlled in accordance with a control signal φ2. The control unit 12B performs switching between a charging operation and a discharging operation using a voltage $V_{IN}$ supplied to the output 9c of the adjustment circuit 9B. In addition, as in the embodiment, the control unit 12B may regularly perform switching between the operations on the basis of a period set in advance.

When charging the capacitor C1, the adjustment circuit 9B discharges the capacitor C2. For example, the control unit 12B supplies a control signal φ1 (H) and a control signal φ2 (L) to the adjustment circuit 9B. As a result, the capacitor C1 is connected to the power generation circuit 8. In addition, the capacitor C1 is disconnected from the power conversion circuit 11. On the other hand, the capacitor C2 is disconnected from the power generation circuit 8. In addition, the capacitor C2 is connected to the power conversion circuit 11. In other words, the capacitor C1 is charged. On the other hand, the capacitor C2 is discharged. For example, the control unit 12B supplies a control signal φ1 (L) and a control signal φ2 (H) to the adjustment circuit 9B. As a result, the capacitor C1 is disconnected from the power generation circuit 8. In addition, the capacitor C1 is connected to the power conversion circuit 11. On the other hand, the capacitor C2 is connected to the power generation circuit 8. In addition, the capacitor C2 is disconnected from the power conversion circuit 11. In other words, the capacitor C1 is discharged. The capacitor C2 is charged.

The adjustment circuit 9B included in the power supply element 1B of Modified Example 2 includes two capacitors C1 and C2. As a result, a period in which electric power is supplied to the power conversion circuit 11 can be increased. In other words, a period (a voltage conversion period) in which a voltage is output from the power conversion circuit 11 can be increased.

MODIFIED EXAMPLE 3

Figure 6:
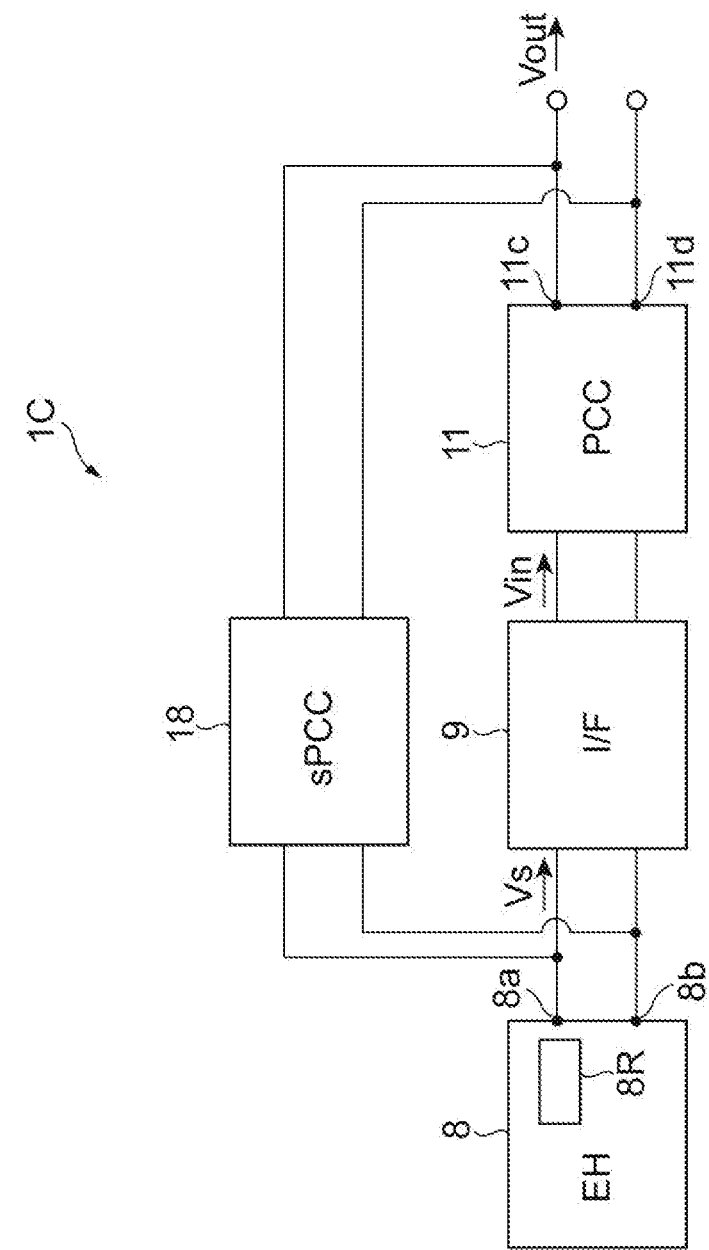
FIG. 6 is a diagram illustrating the configuration of a power supply element of Modified Example 3.

As illustrated in FIG. 6, a power supply element 1C of Modified Example 4 may further include an additional power conversion circuit 18 (a second power conversion circuit) in addition to the power generation circuit 8, the adjustment circuit 9, and the power conversion circuit 11 (a first power conversion circuit). The additional power conversion circuit 18 is connected to the outputs 8a and 8b of the power generation circuit 8 and the outputs 11c and 11d of the power conversion circuit 11. The additional power conversion circuit 18 is disposed in parallel with the adjustment circuit 9 and the power conversion circuit 11. The additional power conversion circuit 18 has a high input impedance of a degree not influenced by the output resistance 8R of the power generation circuit 8. Thus, the additional power conversion circuit 18 can be operated near an open voltage of the power generation circuit 8. When the power generation circuit 8 starts to operate, the additional power conversion circuit 18 generates electric power having a predetermined voltage. Then, after the output voltage of the power generation circuit 8 reaches an output voltage at the time of a steady operation, the operation of the adjustment circuit 9 starts in accordance with the voltage. According to this configuration, a circuit area that is necessary for starting and steady operations of the adjustment circuit 9 and the power conversion circuit 11 can be decreased. In addition, the power efficiency of the power supply element 1C can be raised.

MODIFIED EXAMPLE 4

Figure 7:
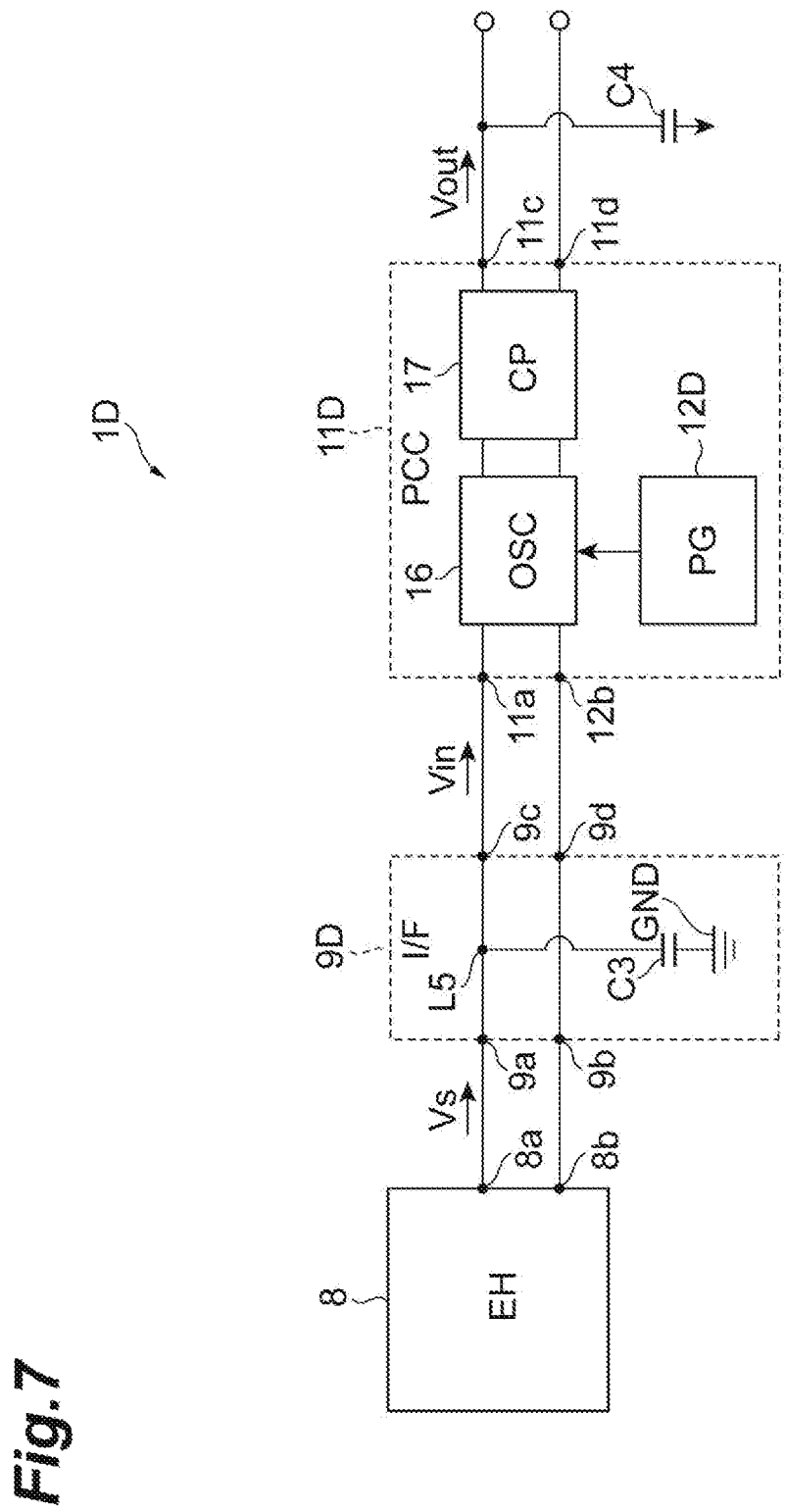
FIG. 7 is a diagram illustrating the configuration of a power supply element of Modified Example 4.

As illustrated in FIG. 7, a power supply element 1D of Modified Example 4 includes the power generation circuit 8, an adjustment circuit 9D, a power conversion circuit 11D, and a control unit 12D. The adjustment circuit 9D includes a line L5 and a capacitor C3. The line L5 connects an input 9a and an output 9c. The capacitor C3 is connected to the line L5 and grounding electric potential GND. The adjustment circuit 9D of Modified Example 3 is acquired by removing the switches S1 and S2 from the adjustment circuit 9. The control unit 12D of Modified Example 3 is a constituent element of the power conversion circuit 11D. The control unit 12D controls the operation of the power conversion circuit 11D. The control unit 12D is a pulse generator (PG). The control unit 12D controls starting and stopping of a transformation operation of the power conversion circuit 11D. The power conversion circuit 11D supplies a control signal to the frequency modulating unit 16. The output 11c of the power conversion circuit 11D may be connected to the capacitor C4. It is preferable that the capacitance of the capacitor C4 be smaller than the capacitance of the capacitor C3. However, the magnitude relation between the capacitors C3 and C4 is not limited to the relation described above. For example, the capacitance of the capacitor C4 may be equal to the capacitance of the capacitor C3. The capacitance of the capacitor C4 may be larger than the capacitance of the capacitor C3.

Also according to this configuration, the control unit 12D can perform switching between a charging operation and a discharging operation of the adjustment circuit 9D. For example, the control unit 12D may stop the operation of the power conversion circuit 11D. The stopping of the operation of the power conversion circuit 11D is stopping oscillation of the frequency modulating unit 16. As a result, electric power supplied from the power generation circuit 8 is charged into the capacitor C3 (a charging operation). In a state in which the operation of the power conversion circuit 11D stops, the impedance of the power conversion circuit 11D can be regarded to be almost infinity (a high impedance state). On the other hand, the control unit 12D causes the operation of the power conversion circuit 11D to be started. The starting of the operation of the power conversion circuit 11D is starting the oscillation of the frequency modulating unit 16. As a result, electric power is supplied from the capacitor C3 to the power conversion circuit 11D (a discharging operation). In a state in which the power conversion circuit 11D operates, the impedance of the power conversion circuit 11D can be regarded to be in a low impedance state. During a discharging operation, electric power output from the power generation circuit 8 is supplied to the power conversion circuit 11. However, the operation of the power conversion circuit 11 is controlled by electric power supplied from the capacitor C3. According to this configuration, the operations of the switches S1 and S2 can be realized by the operation of the power conversion circuit 11D. Thus, the switches S1 and S2 can be omitted. As a result, generation of parasitic resistance can be inhibited. In addition, a control circuit of the switches S1 and S2 can be also omitted. Therefore, the configuration of the power supply element 1D including the adjustment circuit 9D can be simplified.

MODIFIED EXAMPLE 5

Figure 8:
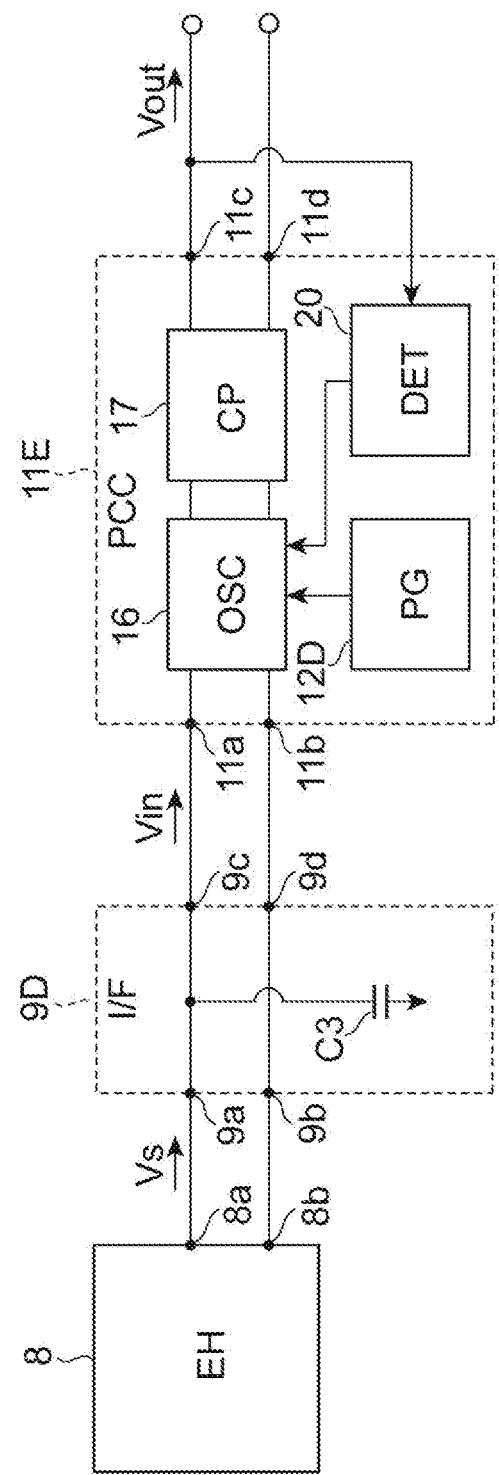
FIG. 8 is a diagram illustrating the configuration of a power supply element of Modified Example 5.

As illustrated in FIG. 8, a power supply element 1E of Modified Example 5 includes the power generation circuit 8, the adjustment circuit 9D, a power conversion circuit 11E, a control unit 12D, and the detection unit 20. The detection unit 20 is connected to an output 11c of the power conversion circuit 11E. The detection unit 20 monitors a voltage supplied to the output 11c. When the voltage of the output 11c exceeds a threshold value, the detection unit 20 stops the operation of the frequency modulating unit 16. When a voltage of the power conversion circuit 11E is below a threshold value, the detection unit 20 starts the operation of the frequency modulating unit 16. When the detection unit 20 stops the operation of the frequency modulating unit 16, a type of control signal of the control unit 12D may be any type. For example, even in a case in which the control unit 12 supplies a control signal used for starting the operation of the power conversion circuit 11E (starting oscillation of the frequency modulating unit 16) to the frequency modulating unit 16, when a control signal for stopping an operation is supplied from the detection unit 20, the frequency modulating unit 16 stops the operation. According to this configuration, restrictions can be placed on an output from the power conversion circuit 11E.

MODIFIED EXAMPLE 6

Figure 9:
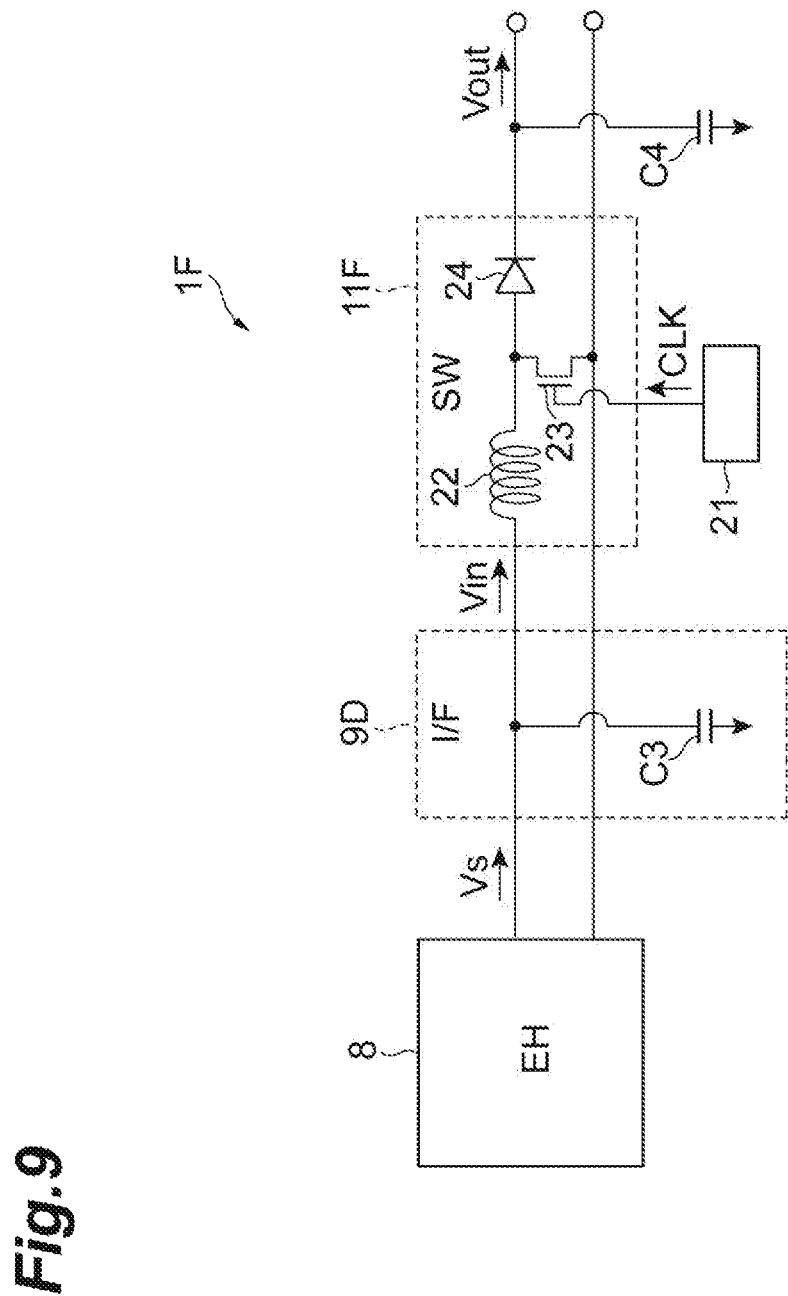
FIG. 9 is a diagram illustrating the configuration of a power supply element of Modified Example 6.
Figure 10:
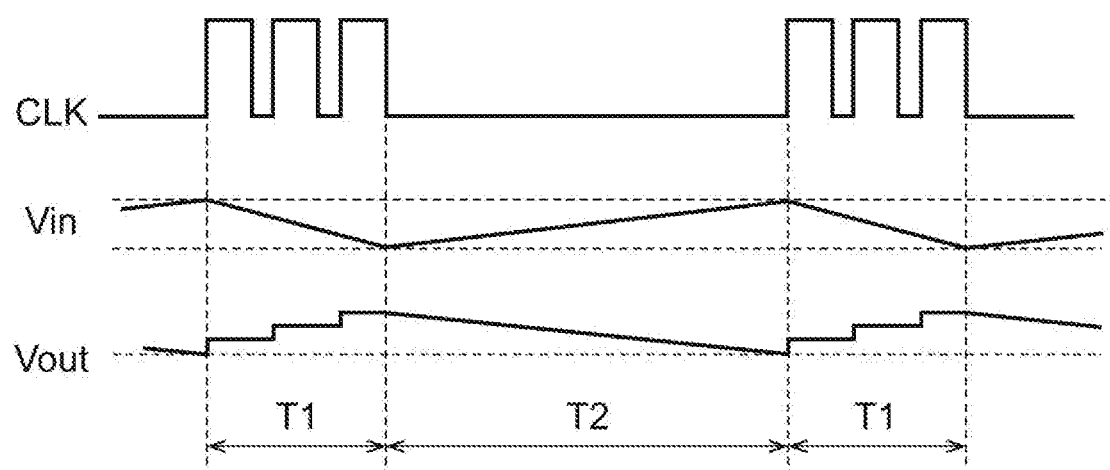
FIG. 10 is an example of a timing diagram of the power supply element of Modified Example 6.

As illustrated in FIG. 9, a power supply element 1F of Modified Example 6 includes the power generation circuit 8, the adjustment circuit 9D, a power conversion circuit 11F, and a clock generating unit 21. The power conversion circuit 11F may be a switching regulator (SW). The switching regulator includes a coil 22, a transistor 23, and a diode 24. In this circuit configuration, starting (see a period T1 illustrated in FIG. 10) and stopping (see a period T2 illustrated in FIG. 10) of an operation of the power conversion circuit 11F are controlled in accordance with a clock signal. The clock signal is supplied from the clock generating unit 21 to the diode 24. Therefore, switching between a charging operation and a discharging operation of the adjustment circuit 9D can be performed.

In other words, in the power supply element 1F of Modified Example 6, the power conversion circuit is a first power conversion circuit, and a second power conversion circuit, which is different from the first power conversion circuit, converting electric power generated by a power generation circuit into a desired form and a control unit that controls operations of the first power conversion circuit and the second power conversion circuit are further included. The second power conversion circuit is disposed in parallel with an impedance adjustment circuit and the first power conversion circuit. An input impedance of the second power conversion circuit is closer to an output impedance of the power generation circuit than an input impedance of the first power conversion circuit. After obtaining electric power from the second power conversion circuit, the control unit obtains electric power from the first power conversion circuit.

In addition, the first power conversion circuit and the second power conversion circuit may be provided as mutually different circuits. In addition, by controlling operating conditions of one power conversion circuit, switching between a function of the first power conversion circuit and a function of the second power conversion circuit may be performed.

MODIFIED EXAMPLE 7

Figure 11:
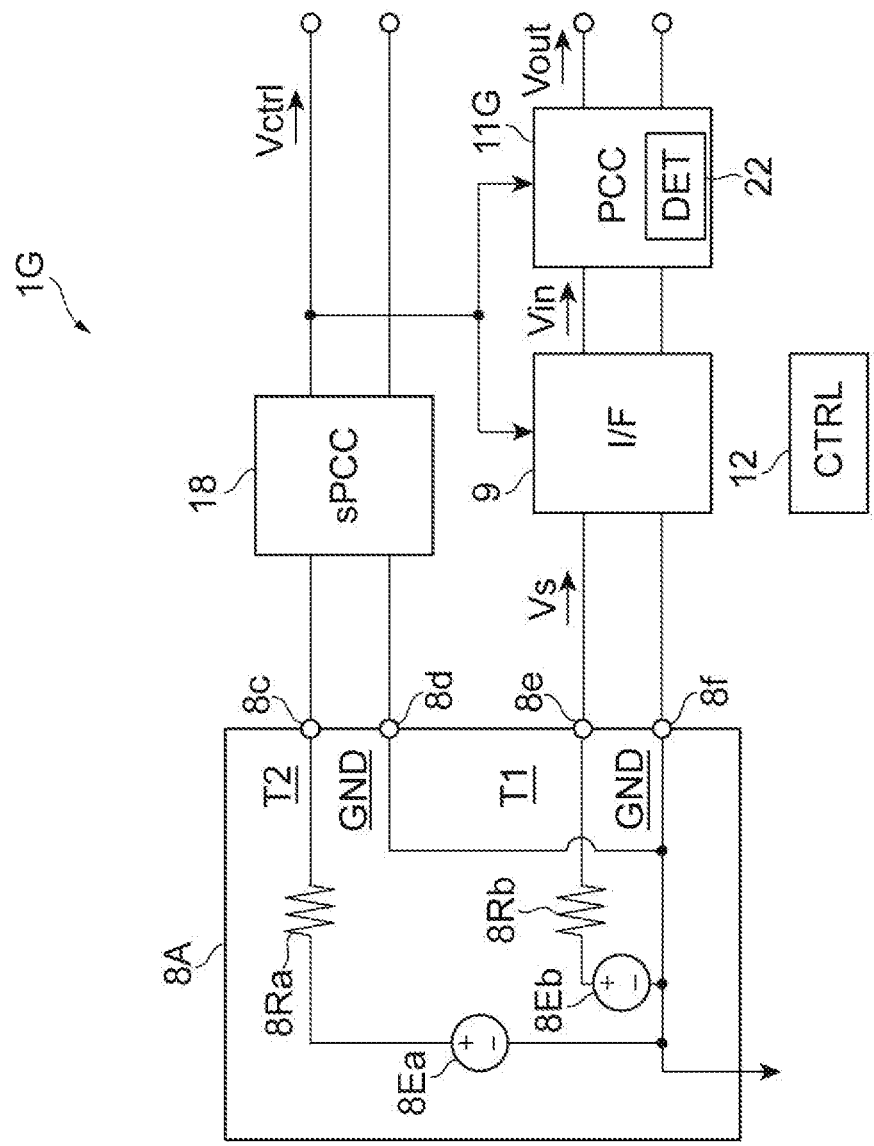
FIG. 11 is a diagram illustrating the configuration of a power supply element of Modified Example 7.

As illustrated in FIG. 11, a power supply element 1G of Modified Example 7 includes the power generation circuit 8A, the adjustment circuit 9, a power conversion circuit 11G, the additional power conversion circuit 18, and a control unit 12. The power generation circuit 8A includes four outputs 8c, 8d, 8e, and 8f, two output resistors 8Ra and 8Rb, and two power generation units 8Ea and 8Eb.

The output resistor 8Ra is connected to the output 8c. The power generation unit 8Ea is connected to the output resistor 8Ra. The grounding electric potential (GND) is connected to the output 8d. The output resistor 8Rb is connected to the output 8e. The power generation unit 8Eb is connected to the output resistor 8Rb. The grounding electric potential (GND) is connected to the output 8f. The output resistor 8Ra is larger than the output resistor 8Rb. The outputs 8e and 8f are connected to the adjustment circuit 9. The outputs 8c and 8d are connected to the additional power conversion circuit 18. An output of the additional power conversion circuit 18 is connected to the adjustment circuit 9 and the power conversion circuit 11.

In this circuit configuration, the additional power conversion circuit 18 autonomously starts a transformation operation. The additional power conversion circuit 18 supplies a voltage $V_{ctrl}$ to the adjustment circuit 9 and the power conversion circuit 11G The power conversion circuit 11G includes a detection unit 25. The detection unit 25 monitors the magnitude of the voltage $V_{ctrl}$. In a case in which the voltage $V_{ctrl}$ is determined to be higher than a threshold value, the detection unit 25 starts an operation of the power conversion circuit 11G As a result, the power supply element 1G can supply a desired electric potential.

[Examination Case 1]

In Examination Case 1, a theoretical limit of an open voltage of a power generation circuit has been checked. Part (a) of FIG. 12 illustrates a model of a power supply element 100 according to Examination Case 1. The power supply element 100 of Examination Case 1 includes a power generation circuit 101 and a power conversion circuit 102. The power generation circuit 101 includes a thermoelectric element (TEG). The power supply element 100 supplies an electric power $P_{OUT}$ to a load 103. The power generation circuit 101 has an output resistance $R_{TEG}$. The power generation circuit 101 outputs an electric power $P_{IN}$ represented using an open voltage $V_{OC}$. The power conversion circuit 102 has a conversion efficiency η. The power conversion circuit 102 outputs the electric power $P_{OUT}$. The load 103 requires an electric power represented using a current $I_{PP}$ and a voltage $V_{PP}$.

First, the operation of the power conversion circuit 102 is represented using Equation (1).

[Math 1]

$$P_{OUT} = \eta \times P_{IN} \quad (1)$$

A condition for efficiently performing transfer of electric power from the power generation circuit 101 to the power conversion circuit 102 is represented in Equation (2). In other words, the condition is to match a load resistance $R_{CONV-LOAD}$ seen from the power generation circuit 101 to the output resistance $R_{TEG}$ of the power generation circuit 101.

[Math 2]

$$R_{CONV-LOAD} = R_{TEG} \quad (2)$$

When the condition represented in Equation (2) is satisfied,

Equation (3) becomes valid.

[Math 3]

$$P_{IN} = (V_{OC}/2)^2 / R_{TEG} \quad (3)$$

A relation between the electric power $P_{OUT}$ output by the power conversion circuit 102, the open voltage $V_{OC}$ of the power generation circuit 101, and the output resistance $R_{TEG}$ is represented using Equation (4).

[Math 4]

$$P_{OPUT} = \eta \times (V_{OC}/2)^2 / R_{TEG} \quad (4)$$

A relation between the conversion efficiency η of the power conversion circuit 102 and the theoretical limit of the lower limit of the open voltage of the power generation circuit 101 has been checked using Equation (4). In Examination Case 1, the following conditions were set.

Voltage $V_{PP}$ of the load 103: 3.3 V

Current $I_{PP}$ of the load 103: 30 μA (Condition 1-1), 3 μA (Condition 1-2).

Output resistance $R_{TEG}$ of the power generation circuit 101: 300Ω

Part (b) of FIG. 12 represents a relation between the conversion efficiency η of the power conversion circuit 102 and the open voltage $V_{OC}$ of the power generation circuit 8. The horizontal axis represents the conversion efficiency η. The vertical axis represents the open voltage $V_{OC}$. A graph G1 is a result of Condition 1-1. A graph G2 is a result of Condition 1-2. Here, the graphs G1 and G2 will be compared with each other. A difference between the graphs G1 and G2 exhibits an effect of enhancing the lower limit value $V_{OC\text{-}MIN}$ of the open voltage $V_{OC}$. According to the graphs G1 and G2, it can be understood that the effect of enhancing the lower limit value $V_{OC\text{-}MIN}$ of the open voltage $V_{OC}$ is small in a case in which the conversion efficiency η is equal to or higher than 30%. A relation between the current $I_{PP}$ of the power conversion circuit 102 and the lower limit value $V_{OC\_MIN}$ of the open voltage of the power generation circuit 8 is represented in Equation (5). Thus, it can be understood that the lower limit value $V_{OC\_MIN}$ of the open voltage strongly depends on the output condition of the power conversion circuit 102.

[Math 5]

$$V_{OC\_MIN} \sim I_{PP}^{1/2} \quad (5)$$

[Examination Case 2]

In Examination Case 2, a relation between the conversion efficiency of the power conversion circuit 102 and the open voltage $V_{OC}$ of the power generation circuit 8 in a case in which the adjustment circuit 104 is applied with the condition of the load 103 fixed was reviewed. Part (a) of FIG. 13 represents a model of a power supply element 200 of Examination Case 2. The power supply element 200 includes a power generation circuit 101, a power conversion circuit 102, and an adjustment circuit 104. In Examination Case 2, the condition of the load 103 was configured to be constant (the current $I_{PP}$=30 uA, and the voltage $V_{PP}$=3.3 V). In addition, the output resistance $R_{TEG}$ of the power generation circuit 8 was configured to be 300Ω. A graph G3 represents a relation between the conversion efficiency η and the open voltage $V_{OC}$ in a case in which the adjustment circuit 104 is applied. A graph G4 represents a relation between the conversion efficiency 11 and the open voltage $V_{OC}$ in a case in which the adjustment circuit 104 is not applied. As illustrated in the graph G3, it can be understood that the minimum value $V_{OC\_MIN}$ of the open voltage of the power supply element 100 can halve by applying the adjustment circuit 104.

[Examination Case 3]

A power supply element 1 including the adjustment circuit 9 has a high efficiency of transfer of electric power. As a result, the power supply element 1 including the adjustment circuit 9 can reduce the scale of the circuit used for obtaining desired electric power. In Examination Case 3, a circuit area of the power supply element 1 including the adjustment circuit 9 and a circuit area of a power supply element 200 (a comparative example) not including the adjustment circuit 9 were compared with each other. Part (a)

of FIG. 14 represents a relation between the output voltage $V_{dd}$ and the circuit area $A_{tot}$ of the power conversion circuit. Part (b) of FIG. 14 represents a relation between the output voltage $V_{dd}$ and the conversion efficiency η of the power conversion circuit.

Common conditions are as below. Output resistance $R_S$ of the power generation circuit: 500Ω.

Output current $I_{PP}$ from the power conversion circuit: 40 μA

The conversion efficiency η of the power conversion circuit of the power supply element (the comparative example) not including the adjustment circuit 9 is assumed to be 20%. As a result, the input current $I_{dd}$ is 200 μA ($I_{dd}=I_{PP}/η$). When the output resistance is 500Ω, and the input current $I_{dd}$ is 200 μA, a voltage drop is 0.1 V ($Rs×I_{dd}$). The output voltage $V_{dd}$ of the power generation circuit is assumed to be 0.2 V. Then, an input voltage supplied to the power conversion circuit is 0.1 V. The graph represented in Part (a) of FIG. 14 will be referred to. According to this graph, it can be understood that the circuit area of the power conversion circuit operating at 0.1 V is 2.5 mm². The graph represented in Part (a) of FIG. 14 is a result of a case in which the output current $I_{PP}$ from the power conversion circuit is 10 μA. In other words, it can be understood that a circuit area that is four times the circuit area described above (2.5 mm²×4) is necessary when the output current $I_{PP}$ required for the power conversion circuit is 40 μA.

Next, the circuit area of the power supply element 1 including the adjustment circuit 9 was checked. The capacitance of the capacitor C of the adjustment circuit 9 was configured to be 10 μF. As an operating condition of the adjustment circuit 9, the time of a charging operation was set to 3.5 msec. A time of a discharging operation was set to 1.0 msec. According to this operation, the output voltage from the capacitor C was set to 0.2 V±10 mV. In a case in which the adjustment circuit 9 is included, a voltage drop may not be taken into account. Thus, an input voltage supplied to the power conversion circuit 11 is 0.2 V. According to Part (a) of FIG. 14, it can be understood that the circuit area of the power conversion circuit 11 operating at 0.2 V was about 0.4 mm².

According to Part (b) of FIG. 14, the conversion efficiency of the power conversion circuit 11 operating at 0.2 V was 30%. In other words, the output current $I_{PP}$ of the power conversion circuit 11 was 60 μA. The current $I_{PP}$ is output only for a predetermined period. Thus, an average value of the current $I_{PP\_AVG}$ was 13 μA (60 μA×1 msec/4.5 msec). It can be understood that a circuit area (about 1.2 mm²=0. 4 mm²×3) that is about three times (40 μA/13 μA) the circuit area described above is necessary when the output current $I_{PP}$ required for the power conversion circuit 11 is 40 μA. In other words, in the assumed conditions, it can be understood that the power supply element 1 including the adjustment circuit 9 can decrease the circuit area to be smaller than the circuit area of the power supply element not including the adjustment circuit 9.

[Examination Case 4]

In Examination Case 4, a relation between the output resistance 8R of the power generation circuit 8 and the circuit area of the power conversion circuit 11 was checked. In addition, a relation between the output resistance 8R of the power generation circuit 8 and the conversion efficiency η was also checked. Furthermore, as a comparison target, a relation between the output resistance 8R and the circuit area, the output resistance 8R, and the conversion efficiency η were checked also for a case in which the adjustment circuit 9 is not included. The set conditions and results are illustrated in Table 1. In addition, a denotation inside parentheses in each of fields of the circuit area and the conversion efficiency η is a proportion when Condition 3-3 (or Condition 3-4) is set as a reference.

TABLE 1

| | Voltage ($V_{dd}$) [V] | Output resistance 8 R [Ω] | Circuit area [mm²] | Conversion efficiency [%] |
|---|---|---|---|---|
| Condition 3-1 | 0.2 | 500 | 1.2 (1/8) | 30 (×1.5) |
| Condition 3-2 | 0.3 | 1000 | 0.3 (1/30) | 45 (×2.2) |
| Condition 3-3 (comparative example) | 0.2 | 500 | 10 (1/1) | 20 (×1) |
| Condition 3-4 (comparative example) | 0.3 | 1000 | 10 (1/1) | 20 (×1) |

In the power supply element (comparative example) not including the adjustment circuit 9, the voltage drop was doubled (0.2 V). For example, in the power supply element (comparative example) not including the adjustment circuit 9, when the voltage $V_{dd}$ was 0.3 V, a voltage supplied to the power conversion circuit was 0.1 V (0.3 V−0.2 V). On the other hand, the power supply element 1 including the adjustment circuit 9 performs an intermittent operation. Thus, in the power supply element 1, an average value of the output current decreases. As a result, in order to supplement the decrease in the average value of the output current, the circuit area of the power supply element 1 needs to be increased. However, in the power supply element 1, a voltage drop may not be taken into account. Thus, a voltage of 0.3 V is supplied to the power conversion circuit 11 of the power supply element 1. As a result, the current density of the output of the power supply element 1 is improved. The influence of the improvement of the current density is about one order of magnitude larger than the influence of the increase in the circuit area. As a result, the circuit area of the power supply element 1 can be configured to be 0.3 mm².

The circuit areas in Condition 3-1 and Condition 3-2 will be focused on. The circuit area at a time when the output resistance 8R is configured to be 500Ω was ⅛ of that of the comparative example (Condition 3-3). On the other hand, the circuit area at a time when the output resistance 8R was configured to be 1000Ω was ¹⁄₃₀ of the circuit area of the comparative example (Condition 3-3). In other words, it can be understood that the circuit area can be decreased in a case in which the output resistance 8R is high. As a result, it can be understood that, even when the output resistance 8R of the power generation circuit 8 is increased, by configuring the open voltage to be high, a satisfactory design can be performed. For example, the number of energy harvesting elements is assumed to be a predetermined number. The number of energy harvesting elements connected in series is doubled. The number of energy harvesting elements connected in parallel is set to a half thereof. As a result, it can be understood that the open voltage can be doubled. In addition, it can be understood that the output resistance can be also doubled. As a result, a necessary circuit area can be decreased in size. Therefore, it can be understood that the degree of freedom of design of the power supply element 1 can be raised.

MODIFIED EXAMPLE 8

FIG. 15 illustrates the configuration of the sensor device 2 as an IoT terminal. The energy conversion element 6 including the power generation circuit 8 outputs electric power ($P_{IN}$) collected from environmental energy. A voltage ($V_{IN}$) output from the energy conversion element 6 is converted into a voltage ($V_{OUT}$) by the power conversion element 7 that is a power supply circuit. This voltage ($V_{OUT}$) is supplied to the sensor element 4 (load element) that is connected to the power conversion element 7. The sensor element 4 includes a sensor 4a and a communication circuit 4d such as a wireless IC.

The operating power of such elements configuring the sensor element 4 is about 10 mW. For example, in a period in which the operation of the sensor element 4 is not required, the sensor element 4 is caused to be in an inactive state. According to such an operation, average electric power of the sensor element 4 can be configured to be about 10 μW.

Environmental energy sources include sun light, heat, vibrations, radio waves, and the like. In many cases, the open voltage ($V_{OC}$) of the energy conversion element 6 having these as energy sources is equal to or lower than 1 V. Thus, in a case in which the output of the energy conversion element 6 is used for driving the sensor element 4, power transformation (boosting) is necessary.

In connection between the energy conversion element 6 outputting electric power and the power conversion element 7 receiving the electric power, it is preferable that electric power should be efficiently transferred from the energy conversion element 6 to the power conversion element 7. Thus, it is preferable that the efficiency of transfer from the energy conversion element 6 to the power conversion element 7 should satisfy a desired value. An example of the desired value is a maximum value of the efficiency of transfer from the energy conversion element 6 to the power conversion element 7. In order to obtain a maximum transfer efficiency, a connection configuration satisfying a so-called impedance matching condition is employed. The impedance matching condition, as a first condition, matches the input resistance of the power conversion element 7 to the output resistance ($R_{ET}$) of the energy conversion element 6. In addition, as a second condition, the power conversion element 7 is controlled such that a voltage ($V_{IN}$) input to the power conversion element 7 is a half ($V_{OC}/2$) of the open voltage ($V_{OC}$).

In addition, the second condition is not limited to the condition of being a half ($V_{OC}/2$) of the open voltage ($V_{OC}$). As a condition in which the transfer efficiency of electric power becomes a maximum, various configurations may be employed in accordance with the type and the like of the energy conversion element 6. The second condition may be appropriately set in accordance with the type and the like of the energy conversion element 6.

In other words, there is a precondition of the power conversion element 7 being able to operate at the voltage ($V_{OC}/2$). In more detail, there is a precondition of the power conversion element 7, which has received the voltage ($V_{OC}/2$), being able to output a voltage that can drive the sensor element 4. However, the energy conversion element 6 that is a power generation element for IoT has a low open voltage ($V_{OC}$). In that case, in order to obtain a voltage ($V_{OC}/2$) at which the sensor element 4 can operate from the energy conversion element 6, the open voltage ($V_{OC}$) of the energy conversion element 6 needs to be high.

The magnitude of the open voltage ($V_{OC}$) corresponds to the magnitude of environmental energy. In other words, in order to obtain a high open voltage ($V_{OC}$), high environmental energy is necessary. In other words, the sensor device 2 cannot be operated without high environmental energy.

Thus, in Modified Example 8, a power supply element that enlarges the range of environmental energy that can drive a load element is provided. In other words, a circuit used for operating the sensor device 2 even in low environmental energy is provided. In other words, Modified Example 8 provides a power supply element that is a circuit system minimizing the open voltage ($V_{OC}$) of the energy conversion element 6 that can drive the sensor element 4. In other words, Modified Example 8 provides a power supply element that is a circuit system minimizing input energy (environment energy)$^{0.5}$ for the energy conversion element 6 that can drive the sensor element 4.

As illustrated in FIG. 16, a power supply element 1H of Modified Example 8 includes the power generation circuit 8, the power conversion element 7H, and a control unit 12H (control unit).

The power conversion element 7H includes the adjustment circuit 9D and a power conversion circuit 11H. The power conversion circuit 11H accepts a voltage ($V_{IN}$) from the adjustment circuit 9D. The power conversion circuit 11H outputs a voltage ($V_{OUT}$) acquired by boosting the voltage ($V_{IN}$). The power conversion circuit 11H includes an oscillation circuit 16H and a boosting circuit 17H.

The oscillation circuit 16H generates a clock signal (CLK) for the boosting circuit 17H. The oscillation circuit 16H supplies the clock signal (CLK) to the boosting circuit 17H. The oscillation circuit 16H generates a clock signal (CLK) on the basis of a control signal ($V_{\_CONTROL}$) supplied from the control unit 12H. For example, the frequency of the clock signal (CLK) is in proportion to the magnitude of the voltage of the control signal ($V_{\_CONTROL}$). In a case in which the voltage of the control signal ($V_{\_CONTROL}$) is high, the frequency of the clock signal (CLK) is high. In a case in which the voltage of the control signal ($V_{\_CONTROL}$) is low, the frequency of the clock signal (CLK) is low.

The boosting circuit 17H accepts a voltage ($V_{IN}$) and a clock signal (CLK). Then, the boosting circuit 17H boosts the voltage ($V_{IN}$) in accordance with the clock signal (CLK).

The control unit 12H outputs a control signal ($V_{\_CONTROL}$) used for the oscillation circuit 16H. The control unit 12H generates a control signal ($V_{\_CONTROL}$) on the basis of a voltage ($V_S$), a voltage ($V_{IN}$), a voltage ($V_{OUT}$), a target voltage ($V_{IN\_TARGET}$), and a target voltage ($V_{OUT\_TARGET}$). Thus, the control unit 12H is connected to the output 8a of the power generation circuit 8, thereby receiving the voltage ($V_S$). In addition, the control unit 12H is connected to the output 9c of the adjustment circuit 9D, thereby receiving the voltage ($V_{IN}$). Furthermore, the control unit 12H is connected to the output 11c of the power conversion circuit 11H, thereby receiving the voltage ($V_{OUT}$). The control unit 12H receives the target voltage ($V_{IN\_TARGET}$) and the target voltage ($V_{OUT\_TARGET}$) from an input means not illustrated in the drawing. In addition, the control unit 12H may generate a target voltage ($V_{IN\_TARGET}$) on the basis of the voltage ($V_S$), the voltage ($V_{IN}$), and the voltage ($V_{OUT}$).

Hereinafter, the operation of the control unit 12H will be described in detail. In the description, FIGS. 17, 18, and 19 will be referred to as is appropriate.

Graphs G17a, G17b, and G17c of Part (a) of FIG. 17, Part (b) of FIG. 17, and Part (c) of FIG. 17 represent relations between electric power and voltages received by the power conversion element 7H. In each of the drawings, the horizontal axis represents a voltage (V) received by the power conversion element 7H. The vertical axis represents electric power (P) received by the power conversion element 7H. In addition, operating points Q17a, Q17b, and Q17c of the power supply element 1H are illustrated.

Part (a) of FIG. 18, Part (b) of FIG. 18, and Part (c) of FIG. 18 represent relations between currents and voltages received by the power conversion element 7H. In each of the diagrams, the horizontal axis represents the voltage (V) received by the power conversion element 7H. The horizontal axis represents the current (I) received by the power conversion element 7H. In addition, the voltage (V) received by the power conversion element 7H may be regarded as a voltage (V) that is output by the energy conversion element 6. Similarly, the current (I) received by the power conversion element 7H may be regarded as a current (V) that is output by the energy conversion element 6. Graphs G18a and G18c represent relations between output voltages and output currents of the energy conversion element 6.

Graphs G18b, G18d, and G18e represent relations between input voltages and input currents of the power conversion element 7H. In a case in which electric power is supplied from the energy conversion element 6 to the power conversion element 7H, the output current of the energy conversion element 6 and the input current of the power conversion element 7H coincide with each other. Thus, for example, a point at which the graph G18a and the graph G18b intersect with each other represents an operating point of the power supply element 1H. In other words, Q18a, Q18b, and Q18c represent operating points of the power supply element 1H The connection between the energy conversion element 6 and the power conversion element 7H satisfies the impedance matching condition as described above. Describing the impedance matching condition again, the first condition is matching the input resistance of the power conversion element 7H to the output resistance ($R_{ET}$) of the energy conversion element 6, and the second condition is performing control of the power conversion element 7H such that the input voltage ($V_{IN}$) of the power conversion circuit 11H is a voltage ($V_{OC}/2$).

Now, a lowest output voltage that is required by the sensor element 4 for the power conversion element 7H is assumed to be set. As a result, an input voltage for allowing the power conversion element 7H to acquire this output voltage is determined. Then, an output voltage ($V_{OC\_MIN}$) (a first voltage) of the energy conversion element 6 that is necessary for the power conversion element 7H to obtain an input voltage is determined.

Part (a) of FIG. 17 and Part (a) of FIG. 18 will be referred to. A state in which sufficient environmental energy is supplied to the energy conversion element 6 will be assumed. At this time, the energy conversion element 6 outputs a voltage ($V_{OC1}$). In order to satisfy the impedance matching condition, the operating voltage of the power conversion element 7H needs to be a voltage ($V_{OC1}/2$) (a second voltage). This state is represented by the operating point Q17a of Part (a) of FIG. 17 and the operating point Q18a represented by Part (a) of FIG. 18. When environmental energy that is sufficient for the energy conversion element 6 is provided, the voltage ($V_{OC1}/2$) is higher than a voltage ($V_{OC\_MIN}$) to be output by the energy conversion element 6. Thus, the voltage ($V_{OC1}/2$) can satisfy the voltage ($V_{OC\_MIN}$) that is to be output by the energy conversion element 6.

The voltage ($V_{OC}$) output by the energy conversion element 6 increases or decreases in accordance with the magnitude of environmental energy received by the energy conversion element 6. For example, a case in which the environmental energy received by the energy conversion element 6 decreases will be assumed. In a case in which the environmental energy received by the energy conversion element 6 decreases, as illustrated in Part (b) of FIG. 17 and Part (b) of FIG. 18, output characteristics (a graph G17b and a graph G18c) of the energy conversion element 6 change.

When the environmental energy received by the energy conversion element 6 decreases, the energy conversion element 6 outputs a voltage ($V_{OC2}$). The voltage ($V_{OC2}$) is lower than the voltage ($V_{OC1}$). In this case, the power conversion element 7H is operated such that the impedance matching condition is satisfied (see Part(b) of FIG. 17 and Part (b) of FIG. 18). In other words, as represented by the operating point Q17b of Part (b) of FIG. 17 and the operating point Q18b of Part (b) of FIG. 18, the operating voltage of the power conversion element 7H is set to the voltage ($V_{OC2}/2$). Then, a case in which the voltage ($V_{OC2}/2$) does not satisfy the voltage ($V_{OC\_MIN}$) to be output by the energy conversion element 6 occurs.

In other words, the power conversion element 7H is assumed to be driven such that it constantly satisfies the impedance matching condition without being in correspondence with an increase/decrease of the environmental energy received by the energy conversion element 6. In that case, a case in which the voltage ($V_{OC\_MIN}$) required for driving the sensor element 4 is not satisfied may occur.

Thus, the power supply element 1H changes a drive condition of the power conversion element 7H in accordance with an increase/decrease in the environmental energy received by the energy conversion element 6. More specifically, in a case in which the environmental energy decreases, the operating voltage of the power conversion element 7H is raised to be higher than the voltage ($V_{OC}/2$). This state is represented by the operating point Q17c of Part (c) of FIG. 17 and the operating point Q18c of Part (c) of FIG. 18. In other words, as illustrated in Part (c) of FIG. 17 and Part (c) of FIG. 18, in a case in which the environmental energy decreases, a condition of satisfying a required voltage ($V_{OC\_MIN}$) is prioritized over a condition of maximizing an efficiency of transferring electric power from the energy conversion element 6 to the power conversion element 7H. As a result, as illustrated in the graph G19a of FIG. 19, the range of environmental energy that can operate a circuit can be enlarged from a range B1 to a range B2. In other words, a lowest value of the environmental energy that can operate the circuit can be set to a smaller value.

Hereinafter, first control and second control that are performed by the control unit 12H will be described.

<First Control of Control Unit>

The first control is control in which the condition of satisfying impedance matching is prioritized. A state in which the first control is selected will be referred to as a standard state. The control unit 12H assumes that an operation of satisfying the impedance matching condition ($V_{OC}/2=V_{IN}$) is performed and compares the voltage ($V_{OC}/2$) with the required voltage ($V_{OC\_MIN}$). For example, the control unit 12H may select the first control in a case in which the voltage ($V_{OC}/2$) is equal to the required voltage ($V_{OC\_MIN}$) ($V_{OC}/2=V_{OC\_MIN}$). In addition, for example, the control unit 12H may select the first control in a case in which the voltage ($V_{OC}/2$) is equal to or higher than the required voltage ($V_{OC\_MIN}$) ($V_{OC}/2 \geq V_{OC\_MIN}$). Furthermore, for example, the control unit 12H may select the first control in a case in which the voltage ($V_{OC}/2$) is larger than a value acquired by multiplying the required voltage ($V_{OC\_MIN}$) by a predetermined coefficient (a) ($V_{OC}/2 > a \times V_{OC\_MIN}$). The predetermined coefficient (a), for example, may be 0.8. When the first control is determined to be performed, the control unit 12H sets the target voltage ($V_{IN\_TARGET}$) of the power conversion element 7H to the voltage ($V_{OC}/2$). Such a selection operation may be repeatedly performed at arbitrary timings during the operation of the power supply element 1H.

When the first control is selected by the control unit 12H, the oscillation circuit 16H supplies a clock signal (CLK) illustrated in Part (a) of FIG. 20 to the boosting circuit 17H. The graphs G21b and G21c of Part (a) of FIG. 20 illustrate an input voltage ($V_{IN}$) and an output voltage ($V_{OUT}$) of the power conversion circuit 11H corresponding to the clock signal (CLK) represented in the graph G21a.

In addition, in the present disclosure, the input voltage ($V_{IN}$) for the power conversion circuit 11H at the time of the standard state is set under a condition that the efficiency of transfer of electric power from the energy conversion element 6 to the power conversion circuit 11H is a maximum. A setting of the input voltage ($V_{IN}$) for the power conversion circuit 11H at the time of this standard state may be regulated from a viewpoint different from that of the condition described above. For example, the input voltage ($V_{IN}$) may be associated with an operating point at which electric power higher than the electric power that can be acquired at a minimum operating point is acquired when relatively compared with the electric power that can be acquired at the minimum operating point. This minimum operating point represents an operating point that is set near the open voltage ($V_{OC}$) of the energy conversion element 6.

<Second Control of Control Unit>

The second control is a control in which a condition of satisfying a required voltage ($V_{OC\_MIN}$) is prioritized. A state in which the second control is selected will be referred to as a minimum energy state. Similar to the first control, the control unit 12H assumes that an operation satisfying the impedance matching condition ($V_{OC}/2=V_{IN}$) is performed and compares the voltage ($V_{OC}/2$) with the required voltage ($V_{OC\_MIN}$). For example, the control unit 12H may select the second control in a case in which the voltage ($V_{OC}/2$) is lower than the required voltage ($V_{OC\_MIN}$) ($V_{OC}/2<V_{OC\_MIN}$). In addition, for example, the control unit 12H may select the second control in a case in which the voltage ($V_{OC}/2$) is smaller than a value acquired by multiplying the required voltage ($V_{OC\_MIN}$) by a predetermined coefficient (a) ($V_{OC}/2<a \times V_{OC\_MIN}$). The predetermined coefficient (a), for example, may be 0.8. When the second control is determined to be performed, the control unit 12H sets the target voltage ($V_{IN\_TARGET}$) of the power conversion element 7H to a value larger than the voltage ($V_{OC}/2$). In addition, when the second control is determined to be performed, the control unit 12H may set the target voltage ($V_{IN\_TARGET}$) of the power conversion element 7H to a value acquired by multiplying the voltage ($V_{OC\_MIN}$) by a predetermined coefficient (b) ($V_{IN\_TARGET}=b \times V_{OC\_MIN}$).

In conclusion, when the second control is determined to be performed, the control unit 12H may set the target voltage ($V_{IN\_TARGET}$) to a value that is higher than the voltage ($V_{OC}/2$) and is lower than the voltage ($b \times V_{OC\_MIN}$). Such a selection operation may be repeatedly performed at arbitrary timings during the operation of the power supply element 1H.

When the second control is selected by the control unit 12H, the oscillation circuit 16H supplies a clock signal (CLK) illustrated in Part (b) of FIG. 20 to the boosting circuit 17H. The graphs G21e and G21f of Part (b) of FIG. 20 illustrate an input voltage ($V_{IN}$) and an output voltage ($V_{OUT}$) of the power conversion circuit 11H corresponding to the clock signal (CLK) represented in the graph G21d.

Here, the clock signal (CLK) (the graph G21d) at the time of the second control has a frequency lower than the clock signal (CLK) (the graph G21a) at the time of the first control. In a case in which the frequency of the clock signal (CLK) is high, the number of times of discharging of the capacitor C is large. Thus, an average input current and an average input power for the power conversion element 7H become high. The average input voltage for the power conversion element 7H becomes low. On the other hand, in a case in which the frequency of the clock signal (CLK) is low, the number of times of discharging of the capacitor C is small. Thus, an average input current and an average input power for the power conversion element 7H become low. The average input voltage for the power conversion element 7H becomes high. In other words, by relatively lowing the clock signal (CLK), the voltage ($V_{IN}$) input to the power conversion element 7H can be raised.

Switching between the first control and the second control is performed in accordance with the frequency of the clock signal (CLK) of the oscillation circuit 16H. Thus, in a case in which the control unit 12H selects the first control, the control unit 12H outputs a control signal ($V_{-CONTROL}$) enabling the generation of the clock signal (CLK) represented in Part (a) of FIG. 20. Similarly, in a case in which the control unit 12H selects the second control, the control unit 12H outputs a control signal ($V_{-CONTROL}$) enabling the generation of the clock signal (CLK) represented in Part (b) of FIG. 20. The frequency of the clock signal (CLK) corresponds to the magnitude of the control signal ($V_{-CONTROL}$). For example, the voltage of the control signal ($V_{-CONTROL}$) at the time of the second control is lower than the voltage of the control signal ($V_{-CONTROL}$) at the time of the first control.

In other words, the frequency of the clock signal (CLK) may be regulated in accordance with a ratio between a discharging period (Ta) and a discharging period (Tb, Tc). In other words, a period (High) in which the voltage of the clock signal (CLK) is high is a discharging period, and a period (Low) in which the voltage of the clock signal (CLK) is low is a charging period. For example, a ratio of the discharging period (Ta) to the charging period (Tc) at the time of the second control is lower than a ratio of the discharging period (Ta) to the charging period (Tb) at the time of the first control.

In addition, the relation of the clock signal (CLK) may be regulated in accordance with a so-called duty ratio. For example, a duty ratio at the time of the first control is Ta/(Ta+Tb). A duty ratio at the time of the second control is Ta/(Ta+Tc). Thus, the duty ratio at the time of the second control is lower than the duty ratio at the time of the first control.

In other words, the power supply element 1H of Modified Example 8 is a power supply element that is connected to a load element.

The power supply element includes: the impedance adjustment circuit including the power generation circuit that converts external energy into electric power and outputs the electric power, the power conversion circuit that converts the electric power generated by the power generation circuit into a desired form, the first circuit unit that includes an input port connected to the power generation circuit and an output port connected to the power conversion circuit, and the second circuit unit that includes a connection point connected to the first circuit unit, a grounding point connected to the grounding electric potential, and the capacitor connected between the connection point and the grounding point; and the control unit controlling the power conversion circuit. The control unit performs control of the operation of the power conversion circuit such that, when a second voltage is lower than a first voltage, the input voltage for the power conversion circuit is higher than the second voltage. The first voltage is an input voltage for the power conversion circuit for which the power conversion circuit can output a required voltage from the power conversion circuit for driving a load element. The second voltage is an input voltage for the power conversion circuit for which the efficiency of transfer of electric power from the power generation circuit to the power conversion circuit is a desired value.

The control unit may perform control of the operation of the power conversion circuit such that, when a first voltage is equal to or higher than a second voltage, the input voltage for the power conversion circuit is the second voltage.

The control unit may set a ratio of the discharging period of the capacitor to the charging period of the capacitor when the second voltage is lower than the first voltage to be lower than a ratio of the discharging period of the capacitor to the charging period of the capacitor when the first voltage is equal to or higher than the second voltage.

In a case in which necessary conditions represented in Equations (6) and (7) and FIG. 21 are satisfied, the power supply element 1H performing such an operation can raise the circuit operating point of the power conversion element 7H to be higher than the voltage ($V_{OC}/2$) and near the open voltage ($V_{OC}$). As a result, even in a state in which environmental energy is low, an IoT terminal can be operated. In other words, the power supply element 1H is a circuit system that minimizes the open voltage ($V_{OC}$) of the energy conversion element 6 that can drive the sensor element 4. In addition, the power supply element 1H is a circuit system that minimizes input energy (environmental energy)$^{0.5}$ for the energy conversion element 6 that can drive the sensor element 4. In addition, in the following equation, $P_{out}^{ACT}$ is electric power that is input to the power conversion element 7H. $P_{out}$ is average power of $P_{out}^{ACT}$. $T_{ACT}$ is a period in which electric power ($P_{out}^{ACT}$) is transmitted. $T_{CYC}$ is a period in which electric power ($P_{out}^{ACT}$) is transmitted.

[Math 6]

$$P_{out} = \eta \times P_{in} \quad (6)$$

[Math 7]

$$P_{out} = P_{out}^{ACT} \times \frac{T_{ACT}}{T_{CYC}} \quad (7)$$

OPERATION EXAMPLE 1

Case in which Environmental Energy Received by Energy Conversion Element 6 is Received For example, the power supply element 1H is assumed to be operating in the standard state. In this case, the control unit 12H selects the first control. The environmental energy supplied to the energy conversion element 6 is assumed to decrease. As such a situation, there is a case in which a temperature difference decreases when the energy conversion element 6 is an element performing thermoelectric power generation as an example. In this case, the output voltage ($V_{OC}$) of the energy conversion element 6 decreases. Then, as a result of performing an operation of selecting control using the control unit 12H, a condition for selecting the first control is not satisfied, and a condition for selecting the second control is satisfied. In other words, the standard state is switched to the lowest energy state. Thus, the control unit 12H performs switching from the first control to the second control. According to such an operation, even in a case in which the environmental energy decreases, electric power can be continuously supplied to the sensor device 2.

OPERATION EXAMPLE 2

Case in which Environmental Energy Received by Energy Conversion Element 6 Increase For example, it is assumed that the power supply element 1H is operating in the lowest energy state. In this case, the control unit 12H selects the second control. Then, environmental energy supplied to the energy conversion element 6 is assumed to increase. In this case, the output voltage ($V_{OC}$) of the energy conversion element 6 increases as well. Then, as a result of performing a control selecting operation using the control unit 12H, a condition for selecting the first control is satisfied. In other words, the lowest energy state is switched to the standard state. Thus, the control unit 12H performs switching from the second control to the first control. According to such an operation, the efficiency of transfer of electric power from the energy conversion element 6 to the power conversion element 7H can be maximized.

OPERATION EXAMPLE 3

The control unit 12H may additionally control output of the power conversion element 7H. For example, a case in which the operation of the power supply element 1H is started will be considered. First, the control unit 12H sets the target voltage ($V_{IN\_TARGET}$) of the power conversion element 7H. In a case in which the operation is started, the lowest energy state described above is assumed. Thus, the control unit 12H sets a value higher than the voltage ($V_{OC}/2$) and lower than the voltage ($V_{OC\_MIN}$) as the target voltage ($V_{IN\_TARGET}$). For example, the control unit 12H may set a voltage ($V_{OC\_MIN} \times 0.8$ as the target voltage ($V_{IN\_TARGET}$). When an operation is started, the output voltage ($V_{OUT}$) of the power conversion element 7H is lower than the target voltage ($V_{OUT\_TARGET}$) of the output. In this case, the frequency of the clock signal (CLK) supplied to the power conversion element 7H is raised. Thus, the control unit 12H raises the control signal ($V_{\_CONTROL}$). In accordance with this operation, the boosting circuit 17H boosts an input voltage ($V_{IN}$) and outputs an output voltage ($V_{OUT}$). When the output voltage ($V_{OUT}$) rises, and the output voltage ($V_{OUT}$) becomes equal to the target voltage ($V_{OUT\_TARGET}$) or higher than the target voltage ($V_{OUT\_TARGET}$), the control unit 12H stops the operation of the power conversion element 7H. The power conversion element 7H operates in accordance with reception of the clock signal (CLK).

Thus, the control unit 12H outputs the control signal ($V_{\_CONTROL}$) that is 0 V. In addition, when the sensor element 4 connected to the power conversion element 7H operates, and the output voltage ($V_{OUT}$) is lowered, the control unit 12H starts the boosting operation again. In this way, the output voltage is controlled to be near the target voltage ($V_{OUT\_TARGET}$).

In addition, the first control and the second control described above may be applied to the power supply devices of the embodiment and Modified Examples 1 to 7. In a case in which the first control and the second control are applied, in each of the power supply devices, a signal line connecting the output of the energy conversion circuit and the control unit is provided. In other words, by adding a configuration in which a voltage ($V_S$) is input to the control unit, operations to which the first control and the second control are applied can be performed.

REFERENCE SIGNS LIST 1, 1A, 1B, 1C, 1D, 1E, IF, 1G Power supply element
2 Sensor device
3 Antenna
4 Sensor element
6 Energy conversion element
7, 7B Power conversion element
8, 8A Power generation circuit
8E, 8Ea, 8Eb Power generation unit
8R, 8Ra, 8R Output resistance
9, 9B, 9D Adjustment circuit
11, 11D, 11E, 11F, 11G Power conversion circuit
12, 12A, 12B, 12D Control unit
13 First circuit unit
14 Second circuit unit
14R Output resistance
16 Frequency modulating unit
17 Transformation unit
18 Additional power conversion circuit
20 Detection unit
21 Clock generating unit
22 Coil
23 Transistor
24 Diode
25 Detection unit
C, C1, C2, C3, C4 Capacitor
GND Grounding electric potential
S1 Switch (first switch)
S2 Switch (second switch)
S3 to S6 Switch
P1 Connection point
P2 Grounding point
φ1, φ2 Control signal

The invention claimed is:

1. A power supply element comprising:
a power conversion circuit configured to convert, into a desired form, electric power generated by a power generation circuit configured to convert external energy into the electric power and output the electric power;
an impedance adjustment circuit having a capacitor disposed between an input of the power conversion circuit and a grounding point, and being connected between the power generation circuit and the power conversion circuit; and
a control unit configured to control an operation of the impedance adjustment circuit,
wherein the impedance adjustment circuit includes:
a first switch connected to the power generation circuit;
a second switch connected to the first switch and the power conversion circuit; and
the capacitor having one end connected to a connection point between the first switch and the second switch, and another end connected to the grounding point, and
wherein the control unit performs mutual switching between a charging operation of connecting the power generation circuit to the capacitor by controlling the first switch and disconnecting the power conversion circuit from the capacitor by controlling the second switch and a discharging operation of disconnecting the power generation circuit from the capacitor by controlling the first switch and connecting the power conversion circuit to the capacitor by controlling the second switch.

2. The power supply element according to claim 1, further comprising the power generation circuit.

3. The power supply element according to claim 1, wherein the power conversion circuit includes a charge pump boosting circuit.

4. A power supply element comprising:
a power conversion circuit configured to convert, into a desired form, electric power generated by a power generation circuit configured to convert external energy into the electric power and output the electric power; and
an impedance adjustment circuit having a capacitor disposed between an input of the power conversion circuit and a grounding point, and being connected between the power generation circuit and the power conversion circuit;
wherein the power conversion circuit includes:
a transformation unit configured to boost the electric power received from the capacitor; and
a modulating unit configured to generate a modulating signal for mutually switching between a discharging operation of transmitting the electric power from the capacitor to the transformation unit and a charging operation of not transmitting the electric power from the capacitor to the transformation unit.

5. The power supply element according to claim 4, wherein the power conversion circuit further includes a control unit configured to generate a control signal for the modulating signal for mutually switching between the discharging operation and the charging operation of the modulating unit, and
wherein the control unit generates the control signal for causing the modulating unit to stop the modulating signal for switching from the discharging operation to the charging operation, when a voltage supplied from the capacitor to the power conversion circuit decreases by a predetermined proportion.

6. The power supply element according to claim 4, wherein the power conversion circuit further includes a control unit configured to generate a control signal for mutually switching between a discharging operation and a charging operation of the modulating unit, and
wherein the control unit generates the control signal for causing the modulating unit to generate the modulating signal for switching from the discharging operation to the charging operation based on a voltage output by the transformation unit.

7. The power supply element according to claim 6, wherein the control unit supplies a first control signal or a second control signal to the modulating unit, as the control signal,
wherein the control unit compares a voltage of the electric power output by the power generation circuit with a threshold value, and supplies the first control signal for causing the modulating unit to generate the modulating signal having a first frequency to the modulating unit when the voltage of the electric power output by the power generation circuit is more than or equal to the threshold value, and supplies the second control signal for causing the modulating unit to generate the modulating signal having a second frequency to the modulating unit when the voltage of the electric power output by the power generation circuit is less than the threshold value, and wherein the second frequency is lower than the first frequency.

8. The power supply element according to claim 4, wherein the power conversion circuit further includes a control unit configured to generate a control signal for mutually switching between a discharging operation and a charging operation of the modulating unit, and
wherein the control unit generates the control signal for mutually switching between the discharging operation and the charging operation of the modulating unit every time a predetermined time elapses.

9. The power supply element according to claim 4, further comprising the power generation circuit.

10. The power supply element according to claim 4, wherein the transformation unit is a charge pump boosting circuit.

11. A power supply element comprising:
a power conversion circuit configured to convert, into a desired form, electric power generated by a power generation circuit configured to convert external energy into the electric power and output the electric power; and
an impedance adjustment circuit having a capacitor disposed between an input of the power conversion circuit and a grounding point, and being connected between the power generation circuit and the power conversion circuit,
wherein the power conversion circuit includes:
a transformation unit configured to boost the electric power received from the capacitor; and
a modulating unit configured to output a modulating signal for controlling transmission of the electric power from the capacitor to the transformation unit,
wherein the modulating unit generates the modulating signal based on a result of comparison between a voltage of the electric power output by the power generation circuit and a threshold value.

12. The power supply element according to claim 11, further comprising a control unit configured to supply a first control signal or a second control signal to the modulating unit,
wherein the control unit compares the voltage of the electric power output by the power generation circuit with the threshold value, and supplies the first control signal for causing the modulating unit to generate the modulating signal having a first frequency to the modulating unit when the voltage of the electric power output by the power generation circuit is more than or equal to the threshold value, and supplies the second control signal for causing the modulating unit to generate the modulating signal having a second frequency to the modulating unit when the voltage of the electric power output by the power generation circuit is less than the threshold value, and
wherein the second frequency is lower than the first frequency.

13. The power supply element according to claim 11, further comprising the power generation circuit.

14. The power supply element according to claim 11, wherein the transformation unit is a charge pump boosting circuit.

15. The power supply element according to claim 11, wherein the modulating unit determines a frequency of the modulating signal based on the result of comparison between the voltage of the electric power output by the power generation circuit and the threshold value.

16. The power supply element according to claim 11, wherein the modulating unit determines a duty ratio of the modulating signal based on the result of comparison between the voltage of the electric power output by the power generation circuit and the threshold value.

* * * * *